US009892783B2

(12) United States Patent
Yoshimoto et al.

(10) Patent No.: US 9,892,783 B2
(45) Date of Patent: Feb. 13, 2018

(54) NON-VOLATILE MEMORY DEVICE INCLUDING MEMORY CELLS HAVING VARIABLE RESISTANCE VALUES

(71) Applicant: Panasonic Intellectual Property Management Co., Ltd., Osaka (JP)

(72) Inventors: Yuhei Yoshimoto, Osaka (JP); Yoshikazu Katoh, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/593,333

(22) Filed: May 12, 2017

(65) Prior Publication Data
US 2017/0345492 A1 Nov. 30, 2017

(30) Foreign Application Priority Data

May 26, 2016 (JP) .................................. 2016-105629
Jan. 13, 2017 (JP) .................................. 2017-004698

(51) Int. Cl.
*G11C 11/00* (2006.01)
*G11C 13/00* (2006.01)
*G06F 3/06* (2006.01)

(52) U.S. Cl.
CPC .......... *G11C 13/004* (2013.01); *G06F 3/0604* (2013.01); *G06F 3/0661* (2013.01);
(Continued)

(58) Field of Classification Search
CPC .............. G11C 13/004; G11C 13/0007; G11C 13/0059; G11C 13/0069;
(Continued)

(56) References Cited

U.S. PATENT DOCUMENTS 9,536,581 B2 * 1/2017 Katoh ................ G11C 13/0059
2011/0199812 A1 8/2011 Kitagawa et al.
(Continued)

FOREIGN PATENT DOCUMENTS

JP 2011-165297 8/2011
JP 2013-062867 4/2013
(Continued)

OTHER PUBLICATIONS

Sanu K. Mathew et al., "A 0.19pJ/b PVT-Variation-Tolerant Hybrid Physically Unclonable Function Circuit for 100% Stable Secure Key Generation in 22nm CMOS", ISSCC2014, Feb. 11, 2014.
(Continued)

*Primary Examiner* — David Lam
(74) *Attorney, Agent, or Firm* — McDermott Will & Emery LLP

(57) ABSTRACT

A non-volatile memory device comprises: a memory cell array that includes one or more memory groups each including memory cells, each of the memory cells having variable resistance value to hold a piece of data; a read circuit that, for each of the one or more memory groups, performs a read operation to obtain pieces of time information related to the memory cells in the memory group; and a data generation circuit that generates individual identification information on a basis of order of the memory cells in each of the one or more memory groups, the order corresponding to ascending order or descending order of the pieces of time information related to the memory cells in the memory group. The read circuit obtains each of the pieces of time information on a basis of a discharge phenomenon or charge phenomenon that depends on the resistance value of a corresponding one of the memory cells.

11 Claims, 22 Drawing Sheets

(52) U.S. Cl.
CPC ........ *G06F 3/0679* (2013.01); *G11C 13/0007* (2013.01); *G11C 13/0059* (2013.01); *G11C 13/0069* (2013.01); *G11C 2013/0054* (2013.01)

(58) Field of Classification Search
CPC ........... G11C 2013/0054; G06F 3/0679; G06F 3/0604; G06F 3/0661
USPC .............................. 365/148, 189.15, 185.21
See application file for complete search history.

(56) References Cited

U.S. PATENT DOCUMENTS

| | | |
|---|---|---|
| 2013/0129083 A1 | 5/2013 | Fujino |
| 2013/0194886 A1 | 8/2013 | Schrijen et al. |

FOREIGN PATENT DOCUMENTS

| | | |
|---|---|---|
| JP | 2013-149487 | 8/2013 |
| JP | 2013-545340 | 12/2013 |
| WO | 2012/014291 | 2/2012 |

OTHER PUBLICATIONS

Takeshi Fujino, "Development and Evaluation of Tamper-Resistant Dependable VLSI Systems", Dependable VLSI System Basic Technologies, Principal Investigator assigned in FY 2009, FY2012 Annual Report, Jul. 2, 2011.
An Chen, "Comprehensive Assessment of RRAM-based PUF for Hardware Security Applications", IEDM 2015, Dec. 7, 2015.

\* cited by examiner

FIG. 12

| MODE | SIGNAL NAME | SETTING OF CONVERSION METHOD AND PARAMETER VALUE i |
|---|---|---|
| Tout OUTPUT MODE | α | MEMORY CELL FROM WHICH Tout IS OUTPUT i-TH IS SET AS REFERENCE MEMORY CELL |
| SA ADDRESSING MODE | β | MEMORY CELL READ FROM i-TH SA IS SET AS REFERENCE MEMORY CELL |

FIG. 15

| PROCESSING SIGNAL | SIGNAL NAME | PROCESSING METHOD |
|---|---|---|
| EVEN-ODD NUMBER SCHEME | A | NUMBER OF 1'S OUTPUT IN MEMORY GROUP IS COUNTED. "1" IS OUTPUT WHEN COUNT IS ODD NUMBER AND "0" IS OUTPUT WHEN COUNT IS EVEN NUMBER |
| MAJORITY DECISION SCHEME | B | NUMBER OF 1'S AND NUMBER OF 0'S IN MEMORY GROUP ARE COUNTED. ONE OF "1" AND "0" CORRESPONDING TO LARGER NUMBER IS OUTPUT AS DATA |
| NO PROCESSING | C | NO DATA PROCESSING |

NON-VOLATILE MEMORY DEVICE INCLUDING MEMORY CELLS HAVING VARIABLE RESISTANCE VALUES

BACKGROUND

1. Technical Field

The present disclosure relates to non-volatile memory devices and more specifically to a non-volatile memory device including a plurality of non-volatile resistive memory cells.

2. Description of the Related Art

The market for electronic commerce services rendered via the Internet, such as electronic banking or electronic shopping, is rapidly expanding. Such services are paid for with electronic methods of payment like electronic money using integrated circuit (IC) cards or smartphone terminals whose use is also expanding. These services require high-level security technology for mutual authentication during communication or encryption of communication data all the time in order to provide safe and secure payments.

In terms of software technologies, due to the accumulation of encryption techniques based on program processing, such as sophisticated encryption algorithms, a sufficient level of security has been achieved. However, technological advances have led to a rapid growth of concerns about the direct interception of inside information on circuitry from outside parties.

SUMMARY

One non-limiting and exemplary embodiment provides a non-volatile memory device having a function as a physically unclonable function (PUF) with low power consumption and small space availability.

In one general aspect, the techniques disclosed here feature a non-volatile memory device comprises: a memory cell array that includes one or more memory groups each including memory cells, each of the memory cells having variable resistance value to hold a piece of data; a read circuit that, for each of the one or more memory groups, performs a read operation to obtain pieces of time information related to the memory cells in the memory group; and a data generation circuit that generates individual identification information on a basis of order of the memory cells in each of the one or more memory groups, the order corresponding to ascending order or descending order of the pieces of time information related to the memory cells in the memory group. The read circuit obtains each of the pieces of time information on a basis of a discharge phenomenon or charge phenomenon that depends on the resistance value of a corresponding one of the memory cells.

According to an embodiment of the present disclosure, a non-volatile memory device having a function as a PUF with low power consumption and small space availability is provided.

It should be noted that general or specific embodiments may be implemented as a device, a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 12 is a diagram illustrating a relationship between conversion signals input to a data conversion circuit and modes that executed accordingly by the data conversion circuit;

FIG. 15 is an explanatory diagram of a relationship between processing signals input to a data processing circuit and data processing methods executed accordingly by the data processing circuit;

DETAILED DESCRIPTION

Figure 1:
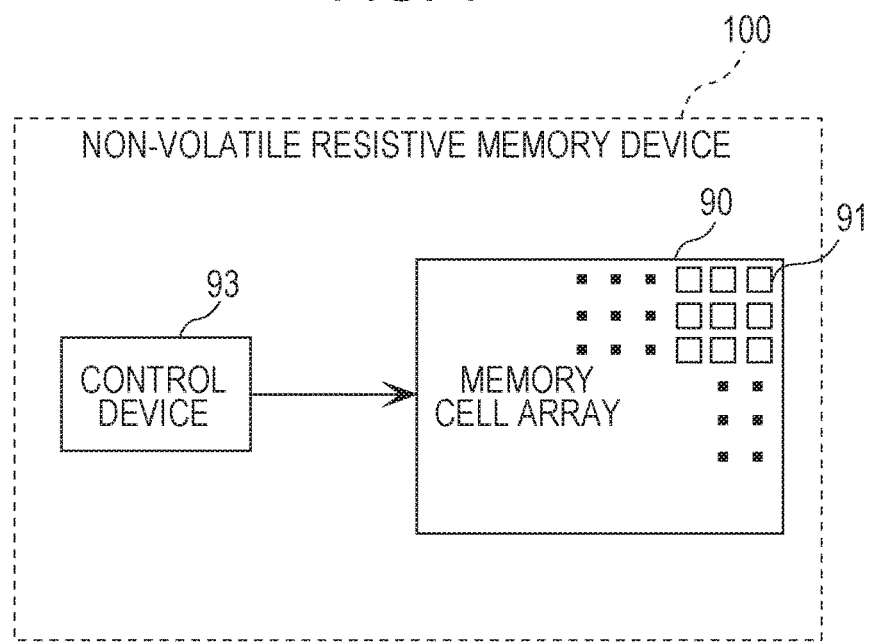
FIG. 1 is a block diagram illustrating an example schematic configuration of a non-volatile resistive memory device according to an embodiment.

Underlying Knowledge Forming Basis of the Present Disclosure

Typical security-enhanced ICs encrypt confidential information by using an internally mounted encryption circuit and use the encrypted information to prevent leakage of information. In this case, it is required that information on an internally stored encryption key (also referred to as a "private key") not be leaked to the outside.

Typical methods for encryption circuits, such as Triple Data Encryption Standard (3DES) and Advanced Encryption Standard (AES), are widely used. These encryption methods employ sophisticated encryption algorithms that make it difficult to identify the encryption key within the realistic constraints of time even if pairs of plaintext (unencrypted data) and ciphertext constituting input and output are obtained and analyzed by making full use of top-speed computers, and the safety thereof has been confirmed. However, such methods, which are regarded as being safe in providing protection against hacking of encrypted data, have still involved a concern for vulnerability of the encryption key to direct hacking.

In an IC that adopts a classic technique, an encryption key is saved in an internal fuse read-only memory (ROM) or a non-volatile memory. A configuration that uses a fuse ROM has experienced a problem that permits the states of the fuse elements to be observed by using X-ray projection or the like and whether the fuse elements are each in a conducting state or not to be analyzed, resulting in saved key information being hacked or stolen. A configuration that uses a non-volatile memory does not lead to analysis by using X-ray projection but has a problem in that key information can be hacked by direct connection of a probe to both ends of each memory element of the non-volatile memory to electrically read the state of the element. To address this problem, security-enhanced ICs are manufactured by using latest fine process technology so as to prevent a probe from being directly connected to an internal circuit. That is, the manufacturing of an IC by using latest fine process technology with a rule of wiring thinner than the diameter of the tip of a probe has addressed a threat of analysis with probing.

However, techniques called side-channel attacks, which have been attempting to break the countermeasure described above, can constitute threats. The side-channel attacks are techniques for, as described in International Publication No. 2012/014291, identifying an encryption key by using side-channel information such as power consumption of a semiconductor device during an operation of each signal processing circuit and radiated electromagnetic waves that are dependent on the power consumption. These techniques are threats because such techniques enable an attacker (or hacker) to hack key information, without causing any physical damage to an IC, when the IC is in actual operation.

Differential power analysis (DPA), which is a type of side-channel attack, was introduced by P. Kocher in 1999. The DPA technique uses the fact that a signal value or signal transition frequency during the operation of an IC has a correlation with power consumption. Specifically, the DPA technique involves integrating the correlation described above multiple times to reduce noise and performing machine learning control to derive a fixed pattern, thereby identifying key information. The example disclosed in International Publication No. 2012/014291 provides an example in which key information is identified through the operation of an encryption processing circuit. Key information stored in a non-volatile memory is read at the timing when the execution of encryption processing acts as a trigger. On the basis of the principle of DPA, if data read at timing similar to the timing described above is identified and obtained, the content of the data might be analyzed by using DPA. In addition, once leakage of the internal specifications of an IC occurs, a hacker will be able to understand the control method of the IC and, as described above, all the data saved in the non-volatile memory, including encryption key information, will be hard-copied so that a duplicate of the IC might be created.

In recent years, physically unclonable function (PUF) technology has been proposed to address the problems described above (Japanese Unexamined Patent Application Publication (Translation of PCT Application) No. 2013-545340, "A 0.19 pJ/b PVT-Variation-Tolerant Hybrid Physically Unclonable Function Circuit for 100% Stable Secure Key Generation in 22 nm CMOS", Sanu K. Mathew, et al., ISSCC 2014 (hereinafter referred to as Non-Patent Literature 1), "The Design and Evaluation Methodology of Dependable VLSI for Tamper Resistance", Takeshi Fujino, "Fundamental technology for dependable VLSI system", CREST 2009 Research Theme, 2012 Annual Report (hereinafter referred to as Non-Patent Literature 2), and "Comprehensive Assessment of RRAM-based PUF for Hardware Security Applications", An Chen, IEDM 2015 (hereinafter referred to as Non-Patent Literature 3)).

PUF technology is an important technology for enhancing security in order to provide secure encryption or mutual authentication.

PUF technology is a technology for generating unique individual identification information different for each IC by exploiting manufacturing variations. In the following description, individual identification information generated by using PUF technology is referred to herein also as "digital ID data". The digital ID data can be regarded as random-number data specific to each device, which is associated with variations in the physical properties of an IC. Since it is not possible to artificially control the physical properties of each IC, data whose physical reproduction is not possible can be generated.

Even if variations in the physical properties of an IC can be controlled to some extent, using random process variations caused during manufacturing would make it easy to create unique digital ID data specific to each IC by using PUF technology. In actual use, however, specific individual identification information determined in advance is very difficult to create on purpose. In a semiconductor process, manufacturing variations occur in terms of various physical properties. Examples of the manufacturing variations include the amount of doping in the semiconductor process, oxide thickness, channel length, the width or thickness of a metal wiring layer, parasitic resistance, and parasitic capacitance.

Specific related-art examples include static random access memory (SRAM) PUFs, as disclosed in Japanese Unexamined Patent Application Publication (Translation of PCT Application) No. 2013-545340 and Non-Patent Literature 1. In these examples, a phenomenon is used in which, in each memory cell in an SRAM, the tendency of whether digital data of the initial value when power to the SRAM is turned on is likely to be in state "1" or state "O" differs mainly due to the Vt variations (variations in the operating voltage) of the transistor in the memory cell. This tendency is specific to each cell of an SRAM mounted on each IC and differs from cell to cell. That is, the initial value data at power-on of the SRAM is used as digital ID data.

In addition, a PUF technology called an Arbiter PUF or a Glitch PUF is disclosed in International Publication No. 2012/014291 and Non-Patent Literature 2. An Arbiter PUF or a Glitch PUF use random changes in the output of a combinational circuit relative to input by using a gate delay or a wiring delay. The gate delay or wiring delay, which changes due to manufacturing variations, constitutes an amount of delay specific to each IC. Thus, each IC outputs a substantially equal result with respect to the input although the result differs from IC to IC, resulting in digital ID data being generated.

In addition, a PUF technology that uses variations in resistance value in a resistive random access memory (ReRAM) that is a non-volatile memory, as disclosed in Non-Patent Literature 3, has also been introduced recently. A ReRAM PUF is a method in which two adjacent cells undergo a write operation under the same conditions and are compared in terms of their magnitude caused by variations in resistance value after the write operation to generate specific data.

Accordingly, by using PUF technology, digital ID data that realizes random numbers specific to each IC is generated as irreproducible data. The digital ID data is used as a device key for encrypting the private key described above. The private key encrypted by using the device key (i.e., digital ID data) is saved in a non-volatile memory in encrypted form. That is, the encrypted private key recorded on the non-volatile memory can be decrypted into the original private key data only by using the device key. Thus, even if all the data in the non-volatile memory is hard-copied by hacking, the device key (i.e., digital ID data) specific to each IC is irreproducible. As a result, it is not possible to restore the encrypted private key to the original form and therefore it is not possible to use the hard-copied data.

As described above, PUF technology is an important technology for enhancing security to provide secure encryption and mutual authentication.

However, PUF technology requires not only security but also low power consumption and small space availability in terms of incorporation into various small Internet of Things (IoT) products such as IC cards, electronic devices, in-vehicle electronic control units (ECUs), or sensors.

One non-limiting and exemplary embodiment provides a non-volatile memory device having a function as a PUF with low power consumption and small space availability.

Prior to the description of an embodiment, the knowledge obtained by the present inventors through experiment will be described in connection with the principle of ReRAMs. The following description provides an example of data to help understand the present disclosure and is not intended to limit the present disclosure to this example.

A non-volatile memory device has a function of, for example, generating individual identification information. In the non-volatile memory device, data encryption and decryption and mutual authentication can be performed on the basis of the generated individual identification information. More specifically, a non-volatile memory device according to an embodiment of the present disclosure has a function of reading the content of a resistance variable memory element and generating specific random-number data unique to each chip for individual identification information used to derive a digital identifier at least partially from the read content. This function can prevent electrical or physical reproduction.

The non-volatile memory device can be mounted on, for example, a card having mounted thereon an IC chip used for mobile electronic money. The IC chip further includes a logic circuit, a volatile memory device, and a microprocessor. These components are used to implement various information security functions such as an encryption function, a digital signature function, and a digital authentication function. When these functions are executed, data encryption using a private key is performed. It is desirable to securely store the private key also in an IC card, as described above, so as not to create a duplicate of the private key.

The storage of a private key described above is implemented by using the PUF technology described above. Random-number digital ID data that is individual identification information obtained by using the PUF technology is used as a device encryption key to encrypt the private key, and the encrypted private key is saved in the non-volatile memory. Since the digital ID data is random numbers different for each IC, data encrypted by using the digital ID data is also a data string specific to each IC. Since the digital ID data, which is irreproducible even if an encrypted private key is copied to another IC by hacking or the like, is not copied, the original private key is not used without authorization.

In a very small device such as an IC card, it is required to significantly reduce the size of a circuit for generating digital ID data, which epitomizes PUF technology. In addition, it is necessary for a typical IC card having no battery to execute various functions in a short period of time with power obtained by wireless power supply during communication. That is, the generation of digital ID data also requires both ultra-low power consumption and high generation speed. Accordingly, the present inventors have studied several related art techniques as possible digital ID data generators to meet the requirement.

In Non-Patent Literature 2, various types of PUF technologies in the related art are benchmarked. In particular, when the error rate of digital ID data is focused, it is found that an SRAM-PUF or Glitch PUF shows the deterioration of data error rate to reach 15% in the worst case if environmental changes are also taken into account. An error correction circuit in which a data error rate of 20% or more can be tolerated is required in view of manufacturing yield, and such requirements result in the circuit scale becoming a limiting factor for an IC. In addition, while in the case of an SRAM-PUF, as in Non-Patent Literature 1, the latest study has reported a cell having a significantly low error rate, the cell size is as large as 4.66 µm² although 22-nm process technology is adopted. This is because a dedicated memory cell with measures undertaken to reduce the error rate. Further use of a special SRAM cell for a PUF may allow an element to be easily identified and is now causing a problem related to tamper resistance.

The present inventors have summarized the features of PUF technology as follows. PUF technology is considered to have mainly the following two features.

Feature (1): Specific digital ID data (an example of individual identification information) is obtained from an irreproducible physical phenomenon.

Feature (2): A physical phenomenon can be obtained only by dynamic circuit control; it is not possible to obtain a required physical phenomenon by static analysis such as direct reading with a probe.

The present inventors further have summarized major performance s for digital ID data obtained by using PUF technology as follows.

Performance requirement (1): Digital ID data obtained by using PUF technology has high randomness and is specific data unique to each IC.

Performance requirement (2): If PUF technology is employed, a circuit added therefor is low in overhead, is implementable at low cost, and is low in power consumption to generate digital ID data.

Performance requirement (3): The number of data bits to be processed in parallel by a generation circuit to generate data bits is increased to enhance the resistance to side-channel attacks.

Performance requirement (4): The error rate of data can be decreased and the circuit scale of the error correction circuit can be reduced.

Performance requirement (5): There are a few constraints on the timing of generating digital ID data and the generation speed is high.

Compared with the features and performance requirements described above, an SRAM-PUF, which is known in the related art, has major constraints on Performance requirement (5). In an SRAM-PUF, due to its principle, digital ID data can be obtained only at power-on. Since an internal SRAM of an IC is used as a data cache, data needs to be temporarily moved or discarded from the SRAM in order to generate ID data by using a PUF, leading to severe constraints on the operation of the system. In order to generate ID data at the desired timing to take measures against such constraints, as disclosed in Non-Patent Literature 1, cells dedicated to a PUF need to be separately used. In this case, the overhead of the circuit increases, resulting in a significant reduction in Performance requirements (2) and (4).

The present inventors have conducted intensive studies on novel digital ID data generation methods that can possibly overcome the issues described above. As a result of such intensive studies, the present inventors have found a phenomenon that the written resistance values of resistance variable elements vary in a normal distribution, and have conceived generation of stable digital ID data from variations of the resistance values.

A resistive memory element changes at least between a first resistance state and a second resistance state in which the resistance value of the memory element is lower than that in the first resistance state in response to the application of an electrical pulse of a predetermined voltage, polarity, and width. Typically, digital data (e.g., "0" and "1") is assigned to the first resistance state and the second resistance state and is saved as information.

Here, the present inventors have focused on a cell group that is in any one of three states, namely, the first resistance state, the second resistance state, and an initial state described below, and classified the cells included in the cell group into two sections in accordance with the resistance values of the cells. That is, each of the cells included in the cell group is represented in binary (i.e., represented by digital data). The resistance values of the cells vary, and the variations of the resistance values are used for the conversion of the cells to obtain digital data. This makes it possible to provide an unprecedented digital ID data generation method applicable to more secure and stable encryption techniques and the like. This is a piece of knowledge obtained by the present inventors.

In addition, a large number of circuit elements for generating digital ID data can be shared with a circuit mounted as a typical non-volatile memory device. This can significantly reduce the circuit scale, which will be increased for the generation of digital ID data, and make the circuit compact.

Furthermore, during data readout by from the non-volatile memory device, due to the structure of the memory cell array, a plurality of pieces of data are read in parallel, resulting in a significant increase in the speed of generation of digital ID data. Additionally, in the case of a side-channel attack, parallel processing allows electromagnetic waves, the number of which corresponds to the total number of pieces of data read in parallel, to be applied and thus can increase the resistance to the attack.

The following is an overview of aspects of the present disclosure based on the knowledge of the present inventors.

A non-volatile memory device according to an aspect of the present disclosure includes: a memory cell array that includes one or more memory groups each including memory cells, each of the memory cells having variable resistance value to hold a piece of data; a read circuit that, for each of the one or more memory groups, performs a read operation to obtain pieces of time information related to the memory cells in the memory group; and a data generation circuit that generates individual identification information on the basis of order of the memory cells in each of the one or more memory groups. The order corresponds to ascending order or descending order of the pieces of time information related to the memory cells in the memory group. In other words, a position of a memory cell in the order corresponds to a position of a corresponding piece of time information in the ascending order or descending order. The read circuit obtains each of the pieces of time information on the basis of a discharge phenomenon or charge phenomenon that depends on the resistance value of a corresponding one of the memory cells With this configuration, the data generation circuit generates individual identification information on the basis of the order in which the pieces of time information that are obtained by the read circuit and that depend on the resistance values of the resistive memory cells are ranked. Thus, individual identification information is generated as PUF data that is based on variations of the resistance values of memory cells in the same resistance state. In addition, a circuit for generating individual identification information can be shared with a circuit mounted as a typical non-volatile memory device, and thus a non-volatile memory device having a function as a PUF with low power consumption and small space availability is realized.

For each of the one or more memory groups, the read circuit may simultaneously read at least two of the memory cells in the memory group in the read operation.

With this configuration, pieces of time information are simultaneously read from a plurality of memory cells in units of memory groups. Thus, individual identification information with high resistance to side-channel attacks is generated quickly.

In addition, the data generation circuit may include a data conversion circuit. For each of the one or more memory groups, the conversion circuit may perform data conversion of signals indicating the pieces of time information. For the data conversion, the data conversion circuit may determine one of the memory cells in the memory group as a reference memory cell, and may assign a first value to a memory cell of the memory cells except for the reference memory cell when a piece of time information related to the memory cell is ranked in the order higher than a piece of time information on the reference memory cell, or may assign a second value, which is different from the first value, to a memory cell of the memory cells except for the reference memory cell when a piece of time information related to the memory cell is ranked lower in the order than the piece of time information on the reference memory cell. The data generation circuit may generate the individual identification information on the basis of data obtained as a result of the data conversion performed by the data conversion circuit.

With this configuration, at least one of a plurality of memory cells that constitute a memory group serves as the reference memory cell and is used for the comparison of the pieces of time information in terms of rank. This configuration enhances the randomness of the individual identification information to be generated, compared with the case where the reference memory cell is fixedly set.

The data generation circuit may include a data conversion circuit. For each of the one or more memory groups, the data conversion circuit may perform data conversion of signals indicating the pieces of time information. For the data conversion, the data conversion circuit may determines one of the memory cells in the memory group as a reference memory cell, and may assign a first value to a memory cell of the memory cells except for the reference memory cell when, as a result of comparison between a piece of time information related to the memory cell and a piece of time information on the reference memory cell, the piece of time information related to the memory cell is smaller than the piece of time information on the reference memory cell, or may assign a second value, which is different from the first value, to a memory cell of the memory cells except for the reference memory cell when, as a result of comparison between a piece of time information related to the memory cell and a piece of time information on the reference memory cell, the piece of time information related to the memory cell is larger than the piece of time information on the reference memory cell. The data generation circuit may generate the individual identification information on the basis of data obtained as a result of the data conversion performed by the data conversion circuit.

A memory cell corresponding to an M-th piece of time information in the ascending order or descending order of the pieces of time information may be determined as the reference memory cell, where M is greater than or equal to 2. A memory cell corresponding to a N-th address among addresses of the memory cells in the memory group may be determined as the reference memory cell, where N is a natural number.

With this configuration, at least one of a plurality of memory cells that constitute a memory group serves as the reference memory cell and is used for the comparison of the pieces of time information. This configuration enhances the randomness of the individual identification information to be generated, compared with the case where the reference memory cell is fixedly set.

The data conversion circuit may assign the first value or the second value to the reference memory cell.

With this configuration, the first value or the second value is also assigned for the reference memory cell and individual identification information is generated. This configuration increases the number of memory cells to be used for generating individual identification information, compared with the case where no value is assigned for the reference memory cell, and enhances the randomness of the individual identification information to be generated.

One of the first value or the second value may be an even number and the other value may be an odd number. The data generation circuit may include a data processing circuit. For each of the one or more memory groups, the data generation circuit may perform data processing to calculate a sum of first values and second values assigned by the data conversion circuit and to output the first value when the sum is an odd number or output the second value when the sum is an even number. The data generation circuit may generate the individual identification information on the basis of data obtained as a result of the data processing performed by the data processing circuit.

With this configuration, digital data obtained as a result of the data conversion performed by the data conversion circuit is subjected to data processing that uses an even-odd number scheme by the data processing circuit before the individual identification information is generated. This configuration enhances the randomness of the individual identification information to be generated, compared with the case where no data processing is performed.

The data generation circuit may include a data processing circuit. For each of the one or more memory groups, the data processing circuit may perform data processing to calculate the number of first values and the number of second values assigned to by the data conversion circuit, and to output the first value or the second value when the number of first values is larger than the number of second values or output the second value or the first value when the number of first values is smaller than the number of second values. The data generation circuit may generate the individual identification information on the basis of data obtained as a result of the data processing performed by the data processing circuit.

With this configuration, digital data obtained as a result of the data conversion performed by the data conversion circuit is subjected to data processing that uses a majority decision scheme by the data processing circuit before the individual identification information is generated. This configuration enhances the randomness of the individual identification information to be generated, compared with the case where no data processing is performed.

The data conversion circuit may select a method for the data conversion in accordance with a conversion signal. The data processing circuit may select a method for the data processing in accordance with a processing signal. The data generation circuit may generate the individual identification information by using the data conversion circuit and the data processing circuit on the basis of a challenge signal, the challenge signal including the conversion signal and the processing signal.

With this configuration, individual identification information that is PUF data is generated as a response on the basis of an externally applied challenge signal that includes a conversion signal and a processing signal. Thus, a non-volatile memory device applicable to high-security challenge-response authentication is realized.

Alternatively, the data conversion circuit may select a method for the data conversion in accordance with a conversion signal, and the data processing circuit may select a method for the data processing in accordance with a processing signal. The data generation circuit may generate the individual identification information by inputting a predetermined fixed conversion signal and a predetermined fixed processing signal to the data conversion circuit and the data processing circuit, respectively.

With this configuration, individual identification information that is PUF data is generated from a predetermined fixed conversion signal and processing signal. Thus, a non-volatile memory device applicable to a high-security unique ID data scheme is realized.

An embodiment of the present disclosure based on the knowledge described above will be described in detail hereinafter with reference to the accompanying drawings.

The following embodiment illustrates a specific example. Numerical values, shapes, materials, constituent elements, arranged positions and connection forms of the constituent elements, steps, the order of the steps, and so on illustrated in the following embodiment are merely examples and are not intended to limit the present disclosure. Among constituent elements described in the following embodiment, a constituent element not recited in an independent claim that defines the present disclosure in its broadest concept is described as optional. Further, same numerals or symbols are given to same or similar components, and the descriptions of such components may be omitted. The drawings schematically illustrate the constituent elements for easy understanding, and the shapes, dimensional ratios, and so on of the constituent elements may not be exact. In manufacturing methods, the order of the steps and the like may be optionally changed and other known steps may be added, if necessary.

Embodiment

Figure 2:
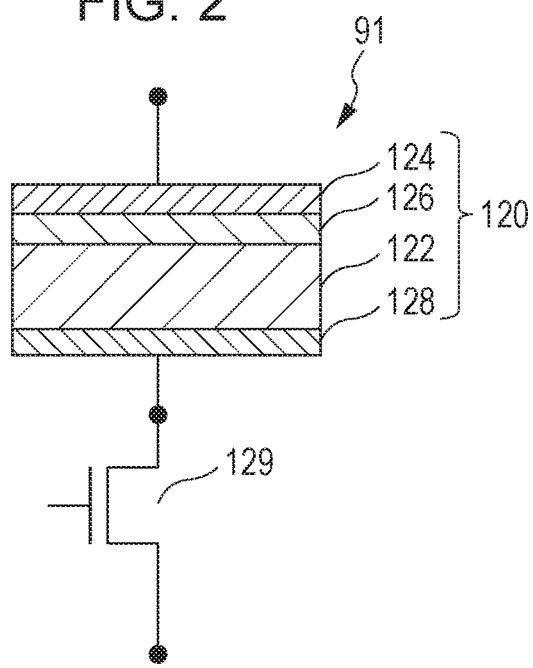
FIG. 2 is a sectional view illustrating an example schematic configuration of a memory cell in the non-volatile resistive memory device according to the embodiment.

Overview of Non-Volatile Resistive Memory Device in Embodiment of Present Disclosure FIG. 1 is a block diagram illustrating an example schematic configuration of a non-volatile resistive memory device 100 according to an embodiment. FIG. 2 is a sectional view illustrating an example schematic configuration of a memory cell 91 in the non-volatile resistive memory device 100 according to the embodiment. A non-volatile resistive memory device is referred to herein also simply as a "non-volatile memory device".

In the example illustrated in FIG. 1, the non-volatile resistive memory device 100 according to this embodiment at least includes a memory cell array 90 and a control device 93. The control device 93 may not necessarily be part of the non-volatile resistive memory device 100, and an external control device connected to the non-volatile resistive memory device 100 may be used to perform the following operation.

The memory cell array 90 is constituted by a plurality of resistive memory cells 91, each of which is capable of holding data by using a change in resistance value. In this embodiment, the memory cell array 90 has a configuration in which the plurality of memory cells 91 are arranged in an array.

The control device 93 obtains a plurality of pieces of resistance value information (specifically, pieces of time information corresponding to resistance values) from a group of memory cells 91 having resistance values that are in the same resistance state, and detects variations of the pieces of time information. On the basis of the detected variations of the pieces of time information, the control device 93 sets a reference memory cell from among the group of memory cells 91 and compares each of the memory cells in the group of memory cells 91 that are in the same resistance state with the set reference memory cell to determine which of the values 0 and 1 of digital data to assign to the memory cell to thereby generate digital ID data. The term "same resistance state" refers to a single resistance value range used to assign one state of digital information. The control device 93 is a circuit that includes a read circuit described below and a data generation circuit. The read circuit is a circuit that simultaneously performs a read operation on the memory cell array 90 in units of memory groups each including a plurality of memory cells 91 to obtain pieces of time information on the basis of a discharge phenomenon or charge phenomenon that depends on the respective resistance values of the plurality of memory cells 91. The data generation circuit is a circuit that compares the pieces of time information on the plurality of memory cells 91, which are obtained by the read circuit through the read operation, to generate individual identification information.

In general, for example, in the case of assigning binary information that is a minimum unit of a digital quantity to a physical quantity that a memory cell has, a non-volatile memory device determines which of the two values of the binary information to assign depending on whether the physical quantity falls within a certain range greater than or equal to a predetermined threshold value or falls within a certain range less than the predetermined threshold value. A recent non-volatile memory device includes an error correction circuit. In an error correction process performed by the error correction circuit, even if physical quantities of some memory cells do not fall within a range predicted in advance to assign binary information, binary information obtained from the physical quantities is correctly restored. This means that some memory cells in a memory cell group used to configure digital ID data may not necessarily be within the same resistance value range. By definition herein, it is assumed that the functions disclosed herein are implementable if a number of memory cells greater than at least one half of the number of memory cells in a memory cell group used to configure digital ID data are in the same resistance state.

When digital ID data used as individual identification information of the non-volatile resistive memory device 100 is to be generated, a plurality of non-volatile memory cells are used whose resistance values fall within the same resistance value range for any one of the first resistance state, the second resistance state, or an initial state described below. No user data is written to the plurality of non-volatile memory cells. That is, the resistance values are not rewritten. The respective resistance values of the non-volatile memory cells are fixed within a predetermined resistance value range. The resistance values vary within the same resistance value range, and the variations of the resistance values constitute information specific to the non-volatile resistive memory device 100.

The term "resistance value information" refers to information having a correlation with a resistance value and may be the resistance value itself or a value that increases or decreases in accordance with the resistance value. The value that increases or decreases in accordance with the resistance value may be, for example, as described below, a discharge time during which the electric charge accumulated in a capacitor connected in parallel with memory cells is discharged via a selected memory cell or a charge time during which, conversely, the discharged capacitor is charged to a predetermined level by the flow of a predetermined constant current through the capacitor. The discharge time or the charge time is an example of time information based on a discharge phenomenon or charge phenomenon that depends on a resistance value of a memory cell and may be, specifically, a count value or the like counted within a predetermined clock period by a counter. The capacitor is not limited to an element and may be, for example, the parasitic capacitance of wiring or the like.

Resistance value information may be a value measured by using a sense amplifier having a predetermined resolution. Alternatively, resistance value information may be a value obtained by determining within which of a plurality of resistance value ranges separated by a threshold value a value measured by using a sense amplifier falls. In this case, each of the plurality of resistance value ranges may be the one obtained by sub-dividing some of the plurality of resistance value ranges.

In the example illustrated in FIG. 2, each of the memory cells 91 includes a resistance variable element 120. The resistance variable element 120 includes a base layer 122 (composed of, for example, $Ta_2O_5$), a first electrode 124 (composed of, for example, Ir), a resistance variable layer 126 (composed of, for example, $TaO_x$), and a second electrode 128 (composed of, for example, TaN). A transistor 129 is connected to the memory cell 91 to select a specific memory cell.

The memory cell 91 has a property in which the memory cell 91 can take a variable state where the resistance value reversibly transitions among a plurality of variable resistance value ranges upon application of a plurality of different electrical signals.

The term "initial state" refers to a state where the resistance value falls within an initial resistance value range that does not overlap any variable resistance value range. A memory cell in the initial state is not changed to the variable state unless a forming process is performed. The forming process is an operation of applying a predetermined electrical stress to a memory cell to change the memory cell to a state where the resistance value of the memory cell reversibly transitions among the plurality of variable resistance value ranges.

The electrical stress ("forming stress") applied for the forming process may be, for example, an electrical pulse having a predetermined voltage and time width or a combination of a plurality of electrical pulses. The forming stress may be a cumulative stress. In this case, when the amount of stress accumulated exceeds a predetermined value, the memory cell 91 (FIG. 2) transitions from the initial state to the variable state.

In this embodiment, the memory cell 91 is assumed to have a property of not being changed to a variable state where the resistance value reversibly transitions among the plurality of variable resistance value ranges if no forming process is performed after manufacturing. That is, in the following description, it is assumed that a resistance variable element is in the initial state before forming stress is applied to the resistance variable element after manufacturing by using a semiconductor process or the like.

However, the property described above is an example and is not required. The memory cell 91 may not necessarily be an element that can take the initial state and may be, for example, a so-called forming-less element having only the variable state.

Figure 3:
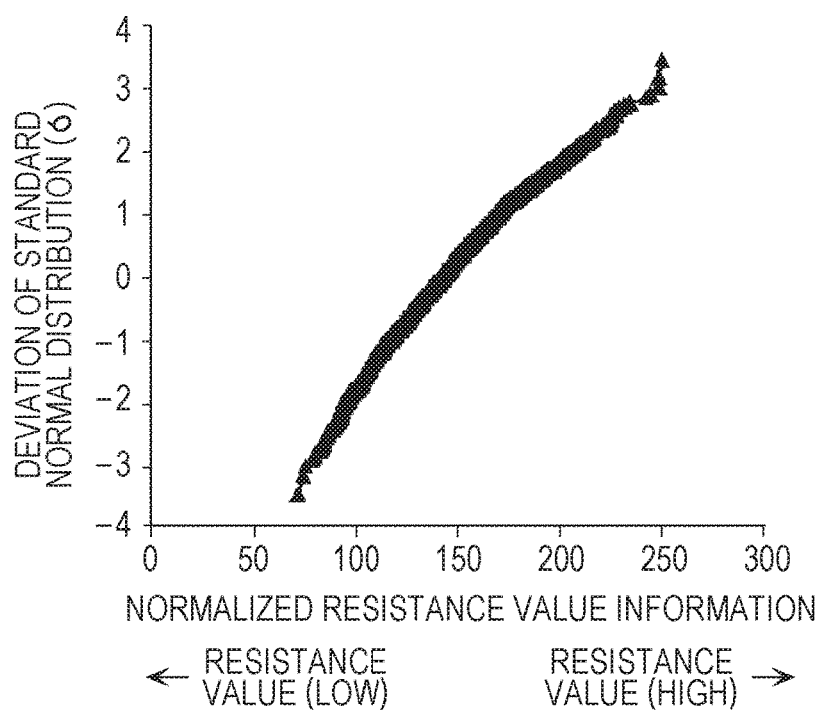
FIG. 3 is a diagram plotting a relationship between normalized resistance value information in a digital ID set state and the deviation of a standard normal distribution of variations in the normalized resistance value information.

The characteristics of variations of the resistance values of memory cells in a digital ID set state (a state where "0" or "1" is written) will be described with reference to FIG. 3. FIG. 3 is a diagram plotting a relationship between normalized resistance value information on memory cells in the digital ID set state and the deviation of a standard normal distribution of variations in normalized resistance value information (plotted with triangles). As illustrated in FIG. 3, the normal distribution for the memory cells is substantially linear with respect to the resistance value information. This indicates a phenomenon in which the variations in resistance distribution are random.

Figure 4:
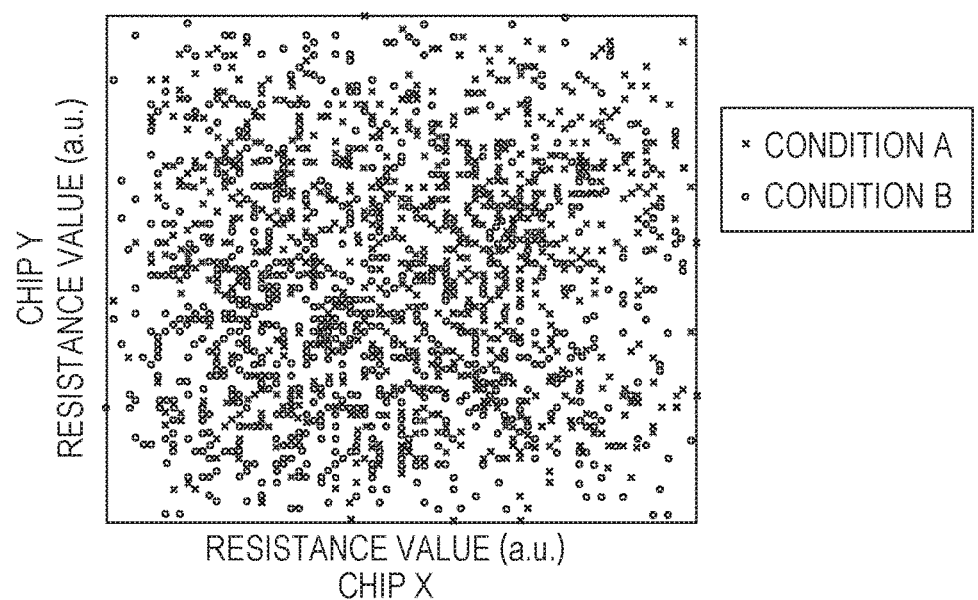
FIG. 4 is a diagram illustrating a relationship in the resistance values at the same address between two different chips when a write operation is performed on the same address of the two chips.

The reason why digital ID data is irreproducible (i.e., is very difficult to reproduce) in the non-volatile memory device according to the embodiment of the present disclosure will be described with reference to FIG. 4. FIG. 4 illustrates a relationship in the resistance values at the same address between two different chips, namely, chip X and chip Y, when a write operation is performed on the same address on the chips under two conditions, namely, write condition A (plotted with crosses) and condition B (plotted with circles), with the horizontal axis representing the resistance values on the chip X and the vertical axis representing the resistance values on the chip Y. As can be seen from FIG. 4, no relationship is found between the resistance values under the same condition and at the same address. This holds true for the comparison between the condition A and the condition B, which are different in write voltage or pulse width. That is, when binary data is further generated from a memory group having the same resistance state, it is found that it is not possible (i.e., is very difficult) to write any data at any address.

Figure 5:
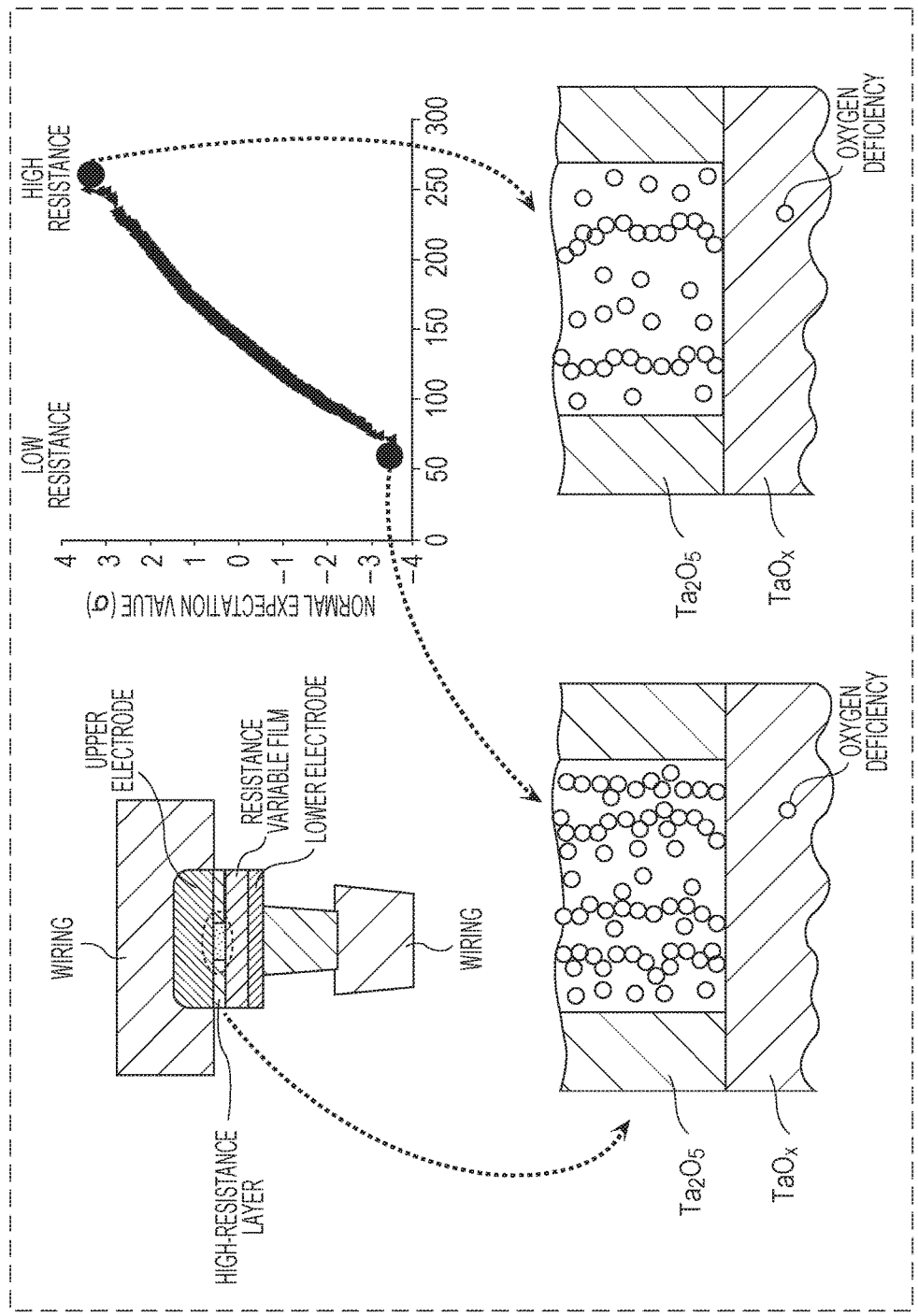
FIG. 5 is a diagram depicting a mechanism for changing the resistance in a resistance variable element.

Next, the reason why digital ID data is very difficult to reproduce will be described in association with a mechanism for changing the resistance in a resistance variable element used in this embodiment. As illustrated in FIG. 5, the resistance variable element, which is initially in an insulating state, suffers a dielectric breakdown upon the forming process, that is, upon application of a high voltage, thereby allowing a conductive path called a filament to be formed in the resistance variable layer. The filament is formed by continuous oxygen-deficient regions produced by the occurrence of oxygen deficiency in the resistance variable layer as a result of the forming process. The locations and number of oxygen-deficient regions are randomly selected for each element. In addition, an element including a relatively large number of oxygen-deficient regions has a low resistance, whereas an element including a relatively small number of oxygen-deficient regions has a high resistance. Accordingly, variations occur. Such variations are uncontrollable (i.e., are very difficult to control). In a case where a filament path is more likely to be formed in a resistance variable element because of formation of more oxygen-deficient regions, the resistance value of the resistance variable element is lower. In contrast, in a case where a resistance variable element at least partially includes a low density of oxygen-deficient regions, a filament path is less likely to be formed and thus the resistance value of the resistance variable element is higher. The resistance values of the resistance variable elements vary, and it is not possible to (i.e., it is very difficult to) artificially control such variations.

Figure 6:
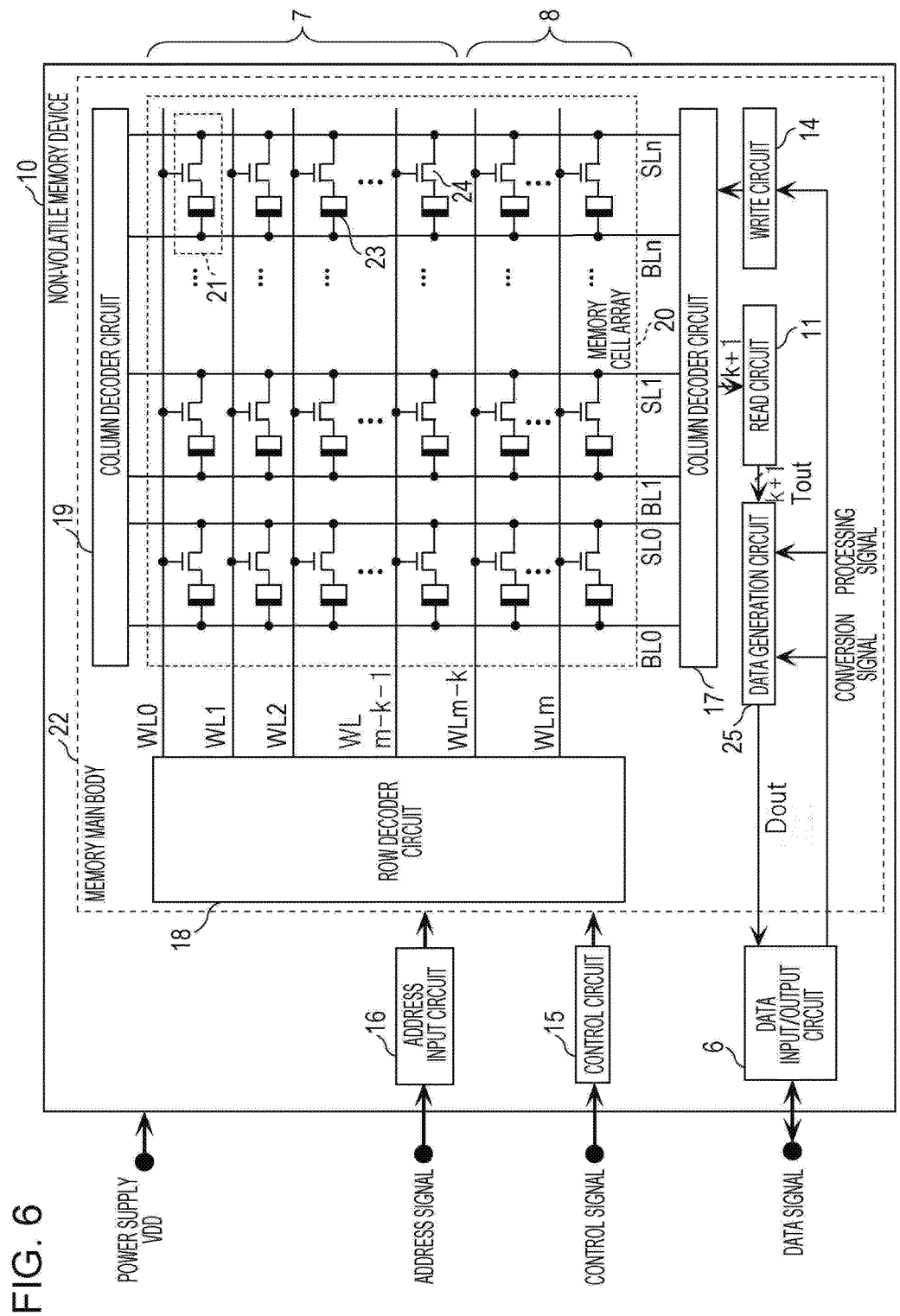
FIG. 6 is a block diagram illustrating a specific example configuration of the non-volatile memory device according to the embodiment.

Configuration and Basic Circuit Operation of Non-Volatile Resistive Memory Device FIG. 6 is a block diagram illustrating a specific example configuration of a non-volatile memory device 10 according to an embodiment. The configuration illustrated in FIG. 6 is merely an example, and a specific configuration of the non-volatile memory device according to the embodiment is not limited to the configuration illustrated in FIG. 6.

As illustrated in FIG. 6, the non-volatile memory device 10 according to the embodiment includes a memory main body 22 on a semiconductor substrate. The non-volatile memory device 10 further includes a data input/output circuit 6, a control circuit 15, and an address input circuit 16.

The memory main body 22 includes a read circuit 11, a write circuit 14, a column decoder circuits 17 and 19, a row decoder circuit 18, a data generation circuit 25, and a memory cell array 20.

The write circuit 14 applies a predetermined voltage for each operation to a selected memory cell 21 to write data.

The read circuit 11 is a circuit that performs a read operation simultaneously (in parallel) on the memory cell array 20 in units of memory groups each including a plurality of memory cells 21 to obtain pieces of time information on the basis of a discharge phenomenon or charge phenomenon that depends on the respective resistance values of the plurality of memory cells 21. In this embodiment, the read circuit 11 detects a change in current flowing through each bit line by using a read scheme (discharge phenomenon) described below and outputs resistance value information on a selected memory cell as time information.

The data generation circuit 25 is a circuit that compares the pieces of time information on the plurality of memory cells 21, which are obtained by the read circuit 11 through the read operation, to generate individual identification information. In this embodiment, the data generation circuit 25 sets a reference memory cell used as a reference for generating binary digital ID data, and generates binary digital ID data (output Dout) on the basis of time information on each memory cell.

The row decoder circuit 18 selects one of m+1 word lines WL connected to the memory cell array 20.

The column decoder circuit 17 selects k+1 bit lines BL and corresponding k+1 source lines SL from among n+1 bit lines BL and n+1 source lines SL, respectively, where k+1 is the number of bits read in parallel (the number of memory cells that constitute a memory group). The column decoder circuit 17 connects the selected k+1 bit lines BL and k+1 source lines SL to the write circuit 14 and the read circuit 11. Note that, n is greater than m, and m is greater than k+1.

These components (i.e., the write circuit 14, the read circuit 11, the data generation circuit 25, the row decoder circuit 18, and the column decoder circuit 17) operate in accordance with the number of rows and/or columns to be read and/or written in parallel.

The read circuit 11 of the non-volatile memory device 10 has the output Tout as time information. The k+1 memory cells (i.e., a memory group) selected by the column decoder circuit 17 and the row decoder circuit 18 are connected to the read circuit 11 via the k+1 bit lines BL, and the read circuit 11 transmits the output Tout, which is time information on the k+1 memory cells, to the data generation circuit 25.

The data generation circuit 25 converts the output Tout, which has been input to the data generation circuit 25, into binary digital ID data Dout on the basis of an externally applied conversion signal and processing signal. That is, the data generation circuit 25 performs conversion to produce binary digital ID data by using the time information (Tout) obtained from the read circuit 11, and transmits the binary digital ID data to the data input/output circuit 6 as output Dout.

As illustrated in FIG. 6, the memory main body 22 has a user data area 7 and a digital ID data area 8 as storage areas. In the user data area 7, any data regarding a user (user data) is stored. The user data is written and read upon selection of an address in the user data area 7. In the digital ID data area 8, the same resistance state is written in a memory cell group to derive individual identification information that is difficult to reproduce. The individual identification information that is difficult to reproduce is used as digital ID data. Accordingly, the digital ID data (an example of individual identification information) is output from the data generation circuit 25 as the output Dout.

The user data area 7 and the digital ID data area 8 may not necessarily be separated by word line in the manner illustrated in FIG. 6 and may be any areas segmented on the memory cell array 20. As the complexity of the rule for physical segmentation into areas increases, the resistance to attacks such as hacking can be increased.

The memory cell array 20 includes (1) a plurality of word lines WL0, WL1, WL2, . . . , WLm-k-1, WLm-k, . . . , and WLm, which extend in parallel to each other, (2) a plurality of bit lines BL0, BL1, . . . , and BLn, which intersect the plurality of word lines WL0, WL1, WL2, . . . , WLm-k-1, WLm-k, . . . , and WLm and which extend in parallel to each other, and (3) a plurality of source lines SL0, SL1, SL2, . . . , and SLn, which intersect the plurality of word lines WL0, WL1, WL2, . . . , WLm-k-1, WLm-k, . . . , and WLm and which extend in parallel to each other and also extend in parallel to the bit lines BL0, BL1, . . . , and BLn. The memory cell array 20 is sectioned into the user data area 7 and the digital ID data area 8 by word line in such a manner that the user data area 7 includes the word lines WL0, WL1, WL2, . . . , and WLm-k-1 and the digital ID data area 8 includes the word lines WLm-k, . . . , and WLm. Memory cells 21 are disposed at the respective intersections of the plurality of word lines WL0, WL1, WL2, . . . , WLm-k-1, WLm-k, . . . , and WLm and the plurality of bit lines BL0, BL1, . . . , and BLn.

Figure 8:
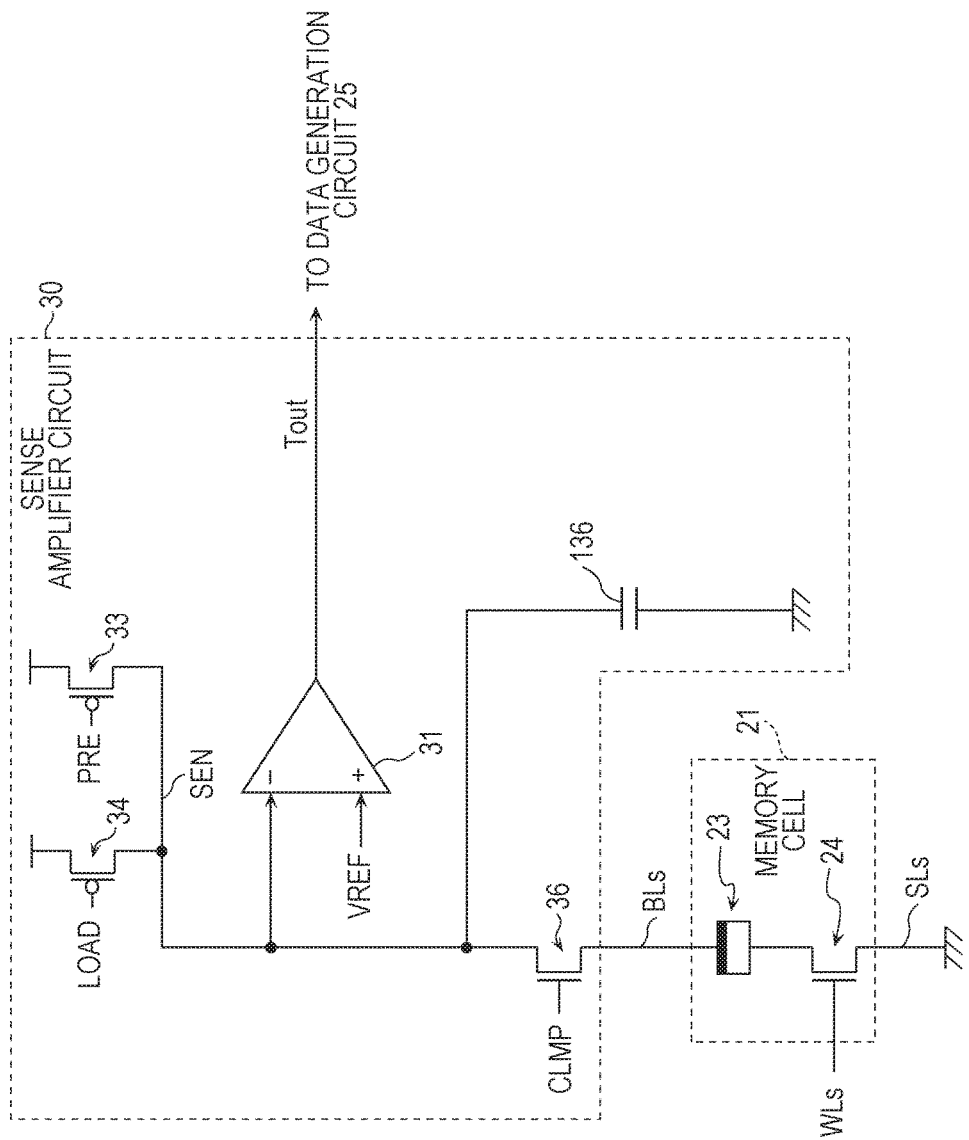
FIG. 8 is a circuit diagram illustrating an example configuration of a sense amplifier circuit in the non-volatile memory device.

As illustrated in FIG. 8, each of the memory cells 21 includes a resistance variable element 23 and a transistor 24. Each of the word lines WL0, WL1, WL2, . . . , WLm-k-1, WLm-k, . . . , and WLm is connected to the gate terminal of the transistor 24 of the corresponding one of the memory cells 21. Each of the bit lines BL0, BL1, . . . , and BLn is connected to the second electrode of the resistance variable element 23 of the corresponding one of the memory cells 21. First electrodes of the resistance variable elements 23 are respectively connected to second main terminals of the transistors 24. Each of the source lines SL0, SL1, SL2, . . . , and SLn is connected to the first main terminal of the transistor 24 of the corresponding one of the memory cells 21.

The resistance variable elements 23 operate as non-volatile memory elements in the memory cells 21. The non-volatile memory device 10 is a 1T1R non-volatile resistive memory device in which each of the memory cells 21 is constituted by one transistor 24 and one resistance variable element 23. The selection element of each of the memory cells 21 is not limited to the transistor 24. For example, each of the memory cells 21 may include a two-terminal element such as a diode instead.

The control circuit 15 controls the column decoder circuit 17 to select either bit lines or source lines in accordance with a control signal and to connect the selected lines to the write circuit 14 for a write operation or to the read circuit 11 for a read operation. Thereafter, the control circuit 15 causes the write circuit 14 or the read circuit 11 to operate.

The resistance variable elements 23 can have a configuration similar to that of the resistance variable elements 120 described above in the embodiment and are not described in detail herein.

In the example illustrated in FIG. 6, n-channel metal-oxide semiconductor (NMOS) transistors are used as selection transistors in the memory cell array 20. However, the selection transistors are not limited to NMOS transistors and may be p-channel metal-oxide semiconductor (PMOS) transistors.

Figure 7:
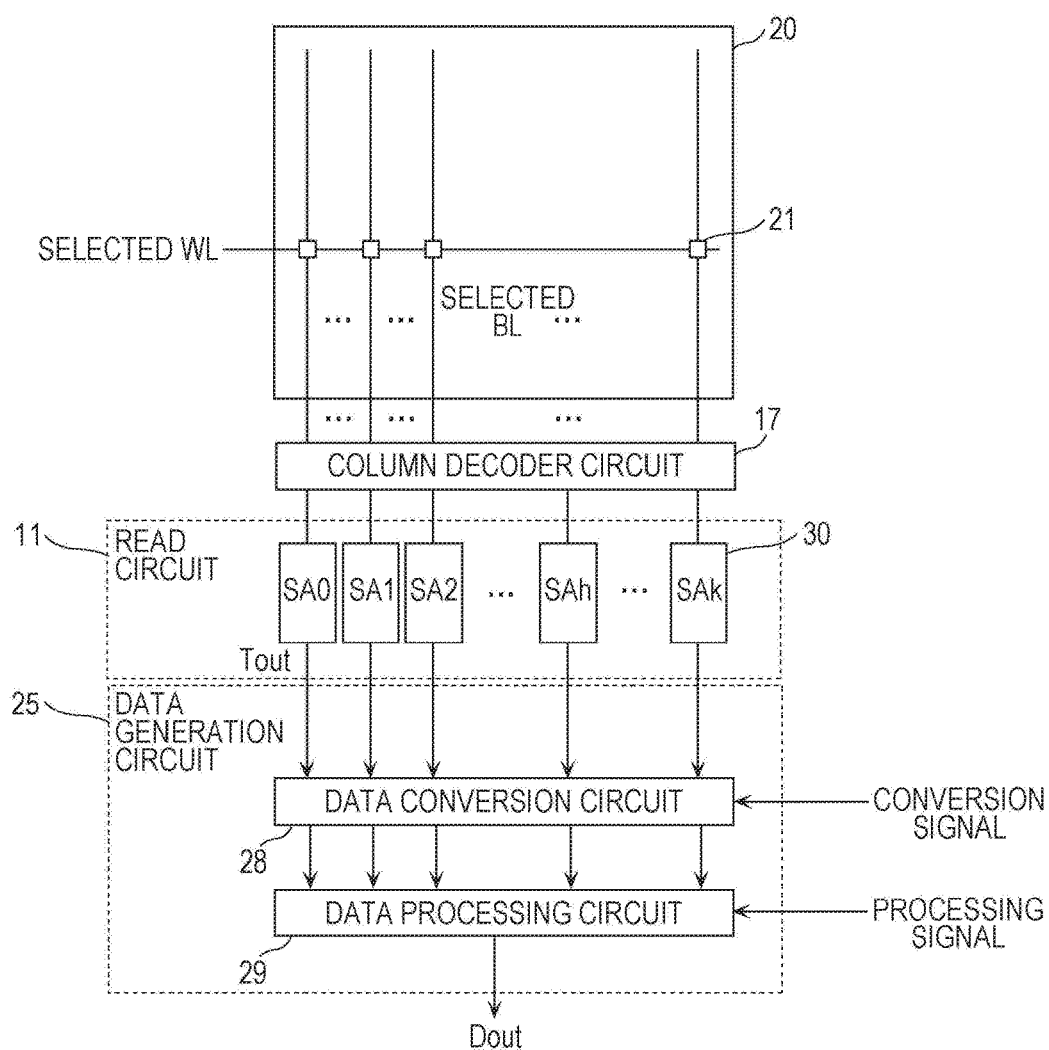
FIG. 7 is a diagram illustrating an example configuration of a read circuit and a data generation circuit in the non-volatile memory device.

FIG. 7 is a diagram illustrating an example configuration of the read circuit 11 and the data generation circuit 25 in the non-volatile memory device 10 according to the embodiment. The read circuit 11 includes k+1 sense amplifier circuits 30 (SA0, SA1, SA2, . . . , and SAk) that are based on the discharge scheme to simultaneously obtain pieces of time information in units of memory groups each including k+1 memory cells. The k+1 bit lines selected by the column decoder circuit 17 are respectively connected to the k+1 sense amplifier circuits 30 that are based on the discharge scheme. The pieces of time information are output from the sense amplifier circuits 30 and are transmitted to the data generation circuit 25. Thus, among the plurality of memory cells 21 that constitute the memory cell array 20, a plurality of memory cells 21 in a memory group selected by the column decoder circuit 17 on the basis of a selected word line WL are simultaneously subjected to a read operation to obtain pieces of time information on the basis of a discharge phenomenon that depends on the respective resistance values of the plurality of memory cells 21.

The data generation circuit 25 is a circuit that compares the pieces of time information on the plurality of memory cells 21, which are obtained by the read circuit 11 through the read operation, to generate digital ID data (an example of individual identification information), and includes a data conversion circuit 28 and a data processing circuit 29. A conversion signal is input to the data conversion circuit 28, and a processing signal is input to the data processing circuit 29.

The data conversion circuit 28 performs data conversion to set at least one of the plurality of memory cells 21 in the memory group as a reference memory cell and to assign a first data value to a data generation memory cell among the plurality of memory cells 21, except for the reference memory cell, when, as a result of comparison between a piece of time information on the data generation memory cell and a piece of time information on the reference memory cell, the piece of time information on the data generation memory cell is smaller than the piece of time information on the reference memory cell, or assign a second data value to the data generation memory cell when the piece of time information on the data generation memory cell is larger than the piece of time information on the reference memory cell. In this embodiment, in the data conversion circuit 28, a reference memory cell is set on the basis of the conversion signal and the pieces of time information obtained from the outputs Tout from the read circuit 11 are each represented in binary as data 0 or 1. That is, in the data conversion circuit 28, a method for performing the data conversion is selected in accordance with the conversion signal.

The data processing circuit 29 is a circuit that applies a process for converting the binary data obtained by the data conversion circuit 28 into data in another format on the basis of the processing signal. That is, in the data processing circuit 29, a data processing method is selected in accordance with the processing signal.

A detailed description will be given below of the conversion signal input to the data conversion circuit 28, the method for setting a reference memory cell on the basis of the conversion signal by using the data conversion circuit 28, the processing signal input to the data processing circuit 29, and the data processing method performed by the data processing circuit 29 on the basis of the processing signal.

FIG. 8 is a circuit diagram illustrating an example configuration of a sense amplifier circuit 30 in the non-volatile memory device 10 according to the embodiment. In FIG. 8, a memory cell 21 to be connected to the sense amplifier circuit 30 is also illustrated. The sense amplifier circuit 30 is one of the k+1 sense amplifier circuits 30 that constitute the read circuit 11 and includes a comparator 31, a precharge PMOS transistor 33, a load PMOS transistor 34, and a clamp NMOS transistor 36.

The comparator 31 has an input terminal to which the voltage of a node SEN is input, another input terminal to which a reference voltage VREF is input, and an output terminal which is connected to the data generation circuit 25 and from which time information Tout is output.

The precharge PMOS transistor 33 has a gate terminal to which a precharge control signal PRE is input, a source terminal to which a power supply voltage VDD is input, and a drain terminal to which the node SEN is connected.

The load PMOS transistor 34 has a gate terminal to which a load control signal LOAD is input, a source terminal to which the power supply voltage VDD is input, and a drain terminal to which the node SEN is connected.

The clamp NMOS transistor 36 has a gate terminal to which a clamp control signal CLMP is input, a source terminal, and a drain terminal. The node SEN is connected to one of the source terminal or the drain terminal of the clamp NMOS transistor 36, and a selected memory cell 21 is connected to the other terminal via the column decoder circuit 17. In FIG. 8, the column decoder circuit 17 is not illustrated.

A capacitor 136 is also connected to the node SEN as a load capacitance.

An operation for outputting a count value (an example of a resistance count value), which is time information, from the sense amplifier circuit 30 will now be described specifically with reference to the configuration diagram (FIG. 8) of the sense amplifier circuit 30 and a timing chart illustrated in FIG. 9.

Figure 9:
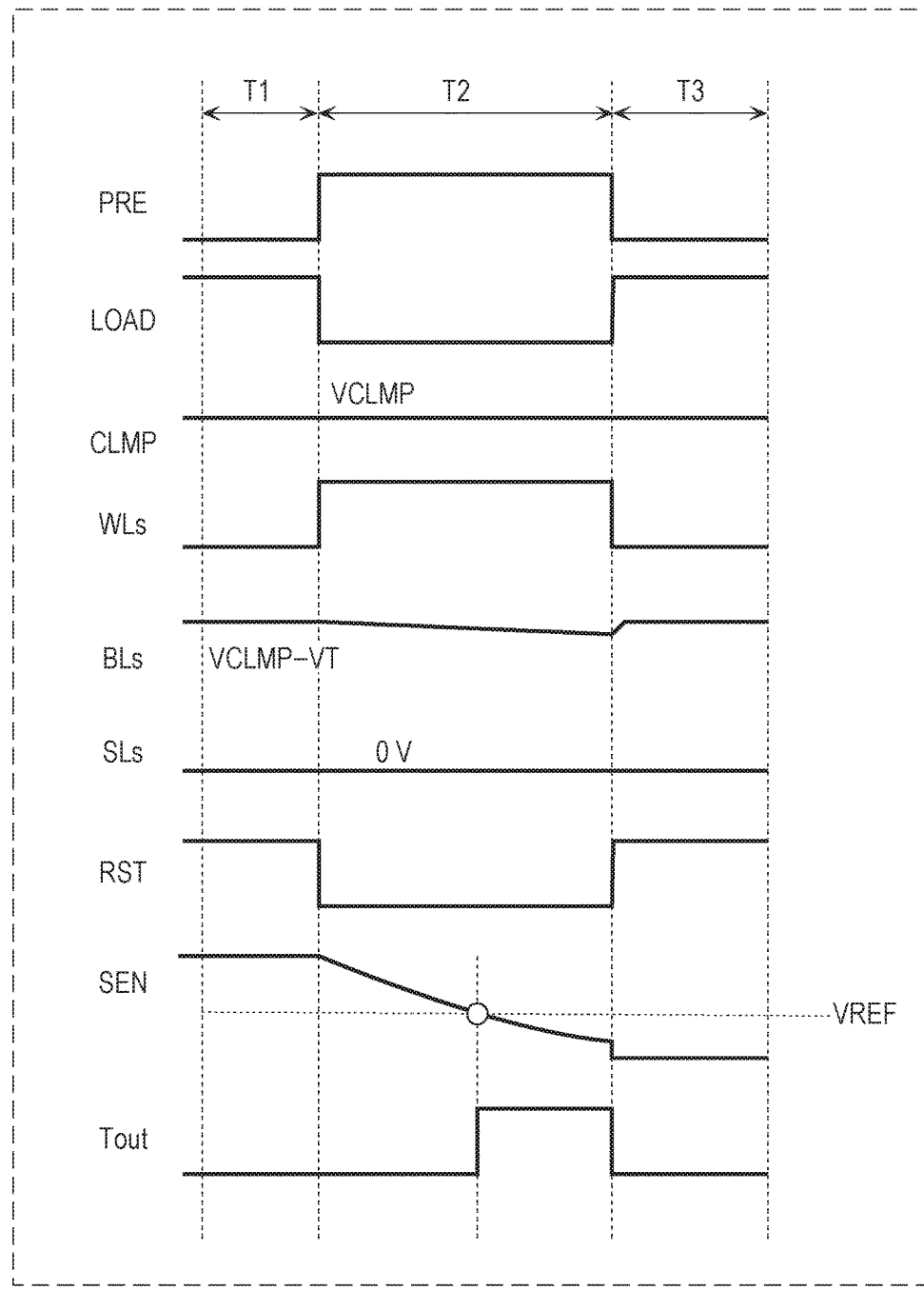
FIG. 9 is a timing chart when the sense amplifier circuit reads a selected memory cell by using a discharge scheme.

FIG. 9 is a timing chart when the sense amplifier circuit 30 reads a selected memory cell by using the discharge scheme in the embodiment.

In a precharge period T1, the precharge control signal PRE is at a low level and the precharge PMOS transistor 33 is in the on state. On the other hand, the load control signal LOAD is at a high level and the load PMOS transistor 34 is in the off state. The potential of a selected word line WLs is at a low level and the transistor 24 is in the off state.

In response to the application of a voltage VCLMP to the gate terminal of the clamp NMOS transistor 36, a selected bit line BLs is precharged to have a potential equal to a value obtained by subtracting VT (a threshold value of the clamp NMOS transistor 36) from VCLMP. A selected source line SLs is fixed to GND. The node SEN is precharged to the power supply voltage VDD.

In a sense period T2, the precharge control signal PRE is set to a high level to thereby bring the precharge PMOS transistor 33 into the off state, and the load control signal LOAD is set to a low level to thereby bring the load PMOS transistor 34 into the on state. Further, the potential of the selected word line WLs is set to a high level to thereby bring the NMOS transistor 24 into the on state.

Then, a voltage is applied to the selected source line SLs from the selected bit line BLs via the selected memory cell 21, and discharging is started accordingly. Discharging continues for a predetermined period within the sense period T2. Throughout the duration of discharging, the potential of the node SEN and the voltage of the reference voltage VREF are continuously compared with each other. The output Tout having the GND level is output in a period during which the potential of the node SEN exceeds the reference voltage VREF, and the output Tout is reversed from GND to the power supply voltage VDD at the same time as the time when the potential of the node SEN falls below the reference voltage VREF. The period (discharge time) from the start of discharging to the rise time (rising edge) of the output Tout depends on the resistance value of the connected memory cell 21. The higher the resistance value of the resistance variable element 23 in the read operation, the longer the discharge time. The discharge time is an example of time information based on a discharge phenomenon or charge phenomenon that depends on the resistance value of the memory cell 21.

In a standby period T3, the node SEN is fixed to GND, and the precharge control signal PRE is set to a low level to thereby bring the precharge PMOS transistor 33 into the on state. On the other hand, the load control signal LOAD is set to a high level to thereby bring the load PMOS transistor 34 into the off state. The potential of the selected word line WLs is at a low level and the transistor 24 is in the off state.

By adjusting the capacitance of the capacitor 136 described above, it is also possible to adjust the discharge time. When the capacitor 136 has a high capacitance, the discharge time of the node SEN is long. When the capacitor 136 has a low capacitance, the discharge time of the node SEN is short. The capacitor 136 is effective in increasing the detection accuracy at the low resistance level for a short discharge time, for example. In the case of low resistance values, however, the discharge time can exceed the resolution of the count value, and such resistance values may be indistinguishable from one another. Accordingly, a capacitance load is added to the node SEN to increase the discharge time, thereby enabling discharge characteristics to be intentionally adjusted to a level such that detection with the resolution is feasible. In the discharge scheme, however, in principle, as the resistance increases, the discharge time increases, resulting in the discharge curve having a gentle slope. As a result, the resolution of time information with respect to the count value increases. That is, the discharge scheme is a scheme that enables accurate time information to be obtained on the high-resistance side.

Furthermore, as illustrated in FIG. 7, since the read circuit 11 includes the k+1 sense amplifier circuits 30, the non-volatile memory device 10 according to this embodiment enables up to k+1 sense amplifier circuits 30 to operate simultaneously in parallel.

Figure 10:
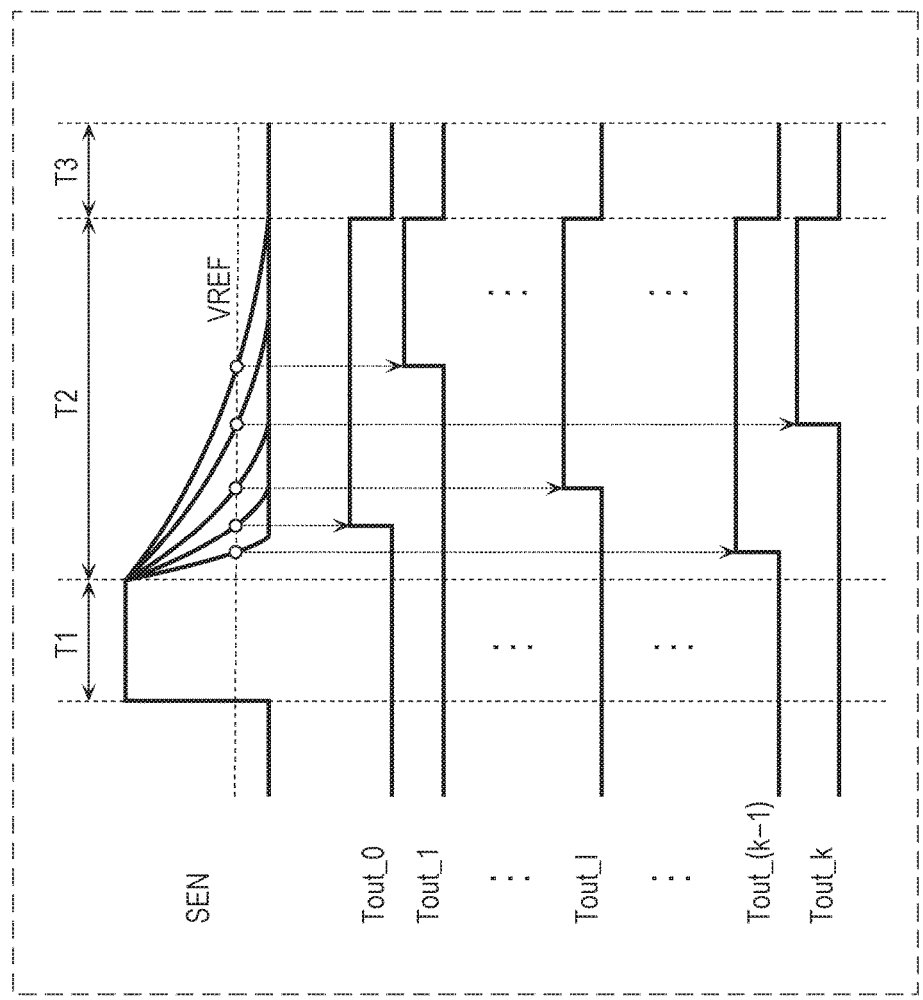
FIG. 10 is a timing chart illustrating rising edges of outputs from k+1 sense amplifier circuits.

FIG. 10 is a timing chart illustrating rising edges (i.e., pieces of time information) of outputs Tout when different memory cells 21 within the digital ID data area 8 that are in the same resistance state are connected to the k+1 sense amplifier circuits 30 and when the discharging of the memory cells 21 starts at the same timing. While k+1 nodes SEN exist, FIG. 10 depicts one node SEN which is used repeatedly for description. As illustrated in FIG. 10, slight variations in resistance value occur in each of the memory cells that are in the same resistance state, and accordingly it is observed that rising edges of the outputs Tout occur at different timings. That is, simultaneous operation of the k+1 sense amplifier circuit 30 in this embodiment enables quick and accurate detection of variations of the resistance values (the order of the resistance values) of k+1 memory cells (i.e., a memory group).

System Operation of Non-Volatile Resistive Memory Device

Figure 11:
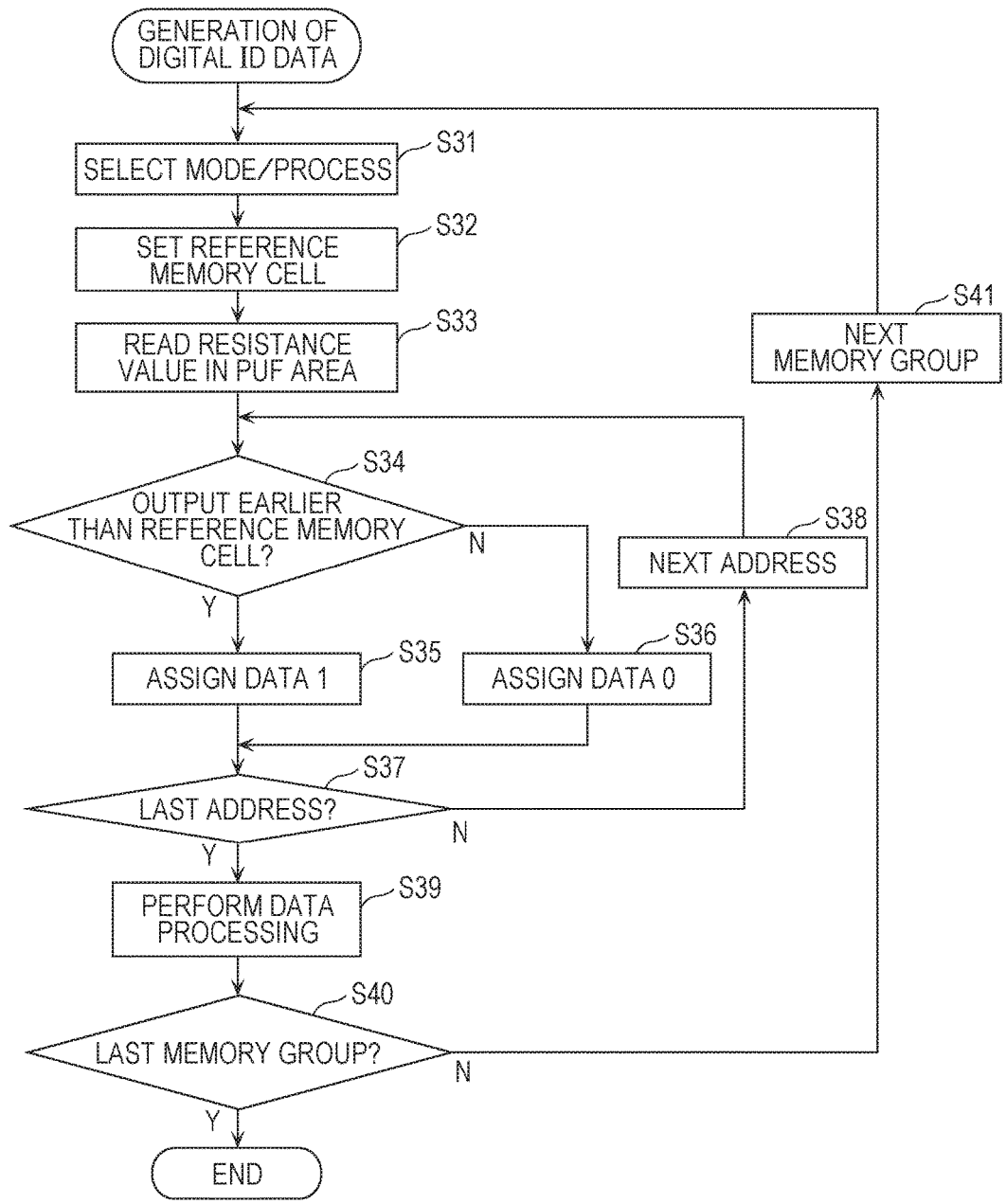
FIG. 11 is a flowchart illustrating an example operation of the non-volatile memory device according to the embodiment.

FIG. 11 is a flowchart illustrating an example operation of the non-volatile memory device 10 according to the embodiment. The operation of the non-volatile memory device 10 will be described hereinafter with reference to FIG. 11. In FIG. 11, a process for generating digital ID data (an example of individual identification information) by using the read circuit 11 and the data generation circuit 25 (the data conversion circuit 28 and the data processing circuit 29) is illustrated.

In step S31, a conversion signal and a processing signal are input to the data generation circuit 25 to select a mode and a process. Modes and processes will be described in detail below. Then, in step S32, the data conversion circuit 28 sets one bit as a reference memory cell within a memory group including k+1 memory cells 21 that operate in parallel on the basis of the mode selected in step S31. In step S33, the k+1 sense amplifier circuits 30 simultaneously start discharging, and rising edges of outputs Tout occur. In step S34, the data conversion circuit 28 compares the rising edge of the output Tout of the reference memory cell set in step S32 with the rising edge of the output Tout of any other memory cell (i.e., a data generation memory cell) in the memory group. Then, the data conversion circuit 28 assigns data "1" to a bit (i.e., a data generation memory cell) whose output Tout is earlier than the output Tout of the reference memory cell in step S35 or assigns data "0" to a bit (i.e., a data generation memory cell) whose output Tout is later than the output Tout of the reference memory cell in step S36. That is, the data conversion circuit 28 performs data conversion to set at least one of a plurality of memory cells in a memory group as a reference memory cell and to assign a first data value to a data generation memory cell among the plurality of memory cells, except for the reference memory cell, when, as a result of comparison between time information on the data generation memory cell with time information on the reference memory cell, the time information on the data generation memory cell is smaller than the time information on the reference memory cell or assign a second data value to the data generation memory cell when the time information on the data generation memory cell is larger than the time information on the reference memory cell.

In step S37, the data conversion circuit 28 determines whether all the bits, except for the reference memory cell, in the memory group have been compared with the reference memory cell and have been assigned data. If the comparison and assignment operation has not been completed, then in step S38, the data conversion circuit 28 transitions to the next address and assigns data to remaining memory cells. In step S39, the data processing circuit 29 further performs data processing on digital data assigned by the data conversion circuit 28 in accordance with the data processing method selected in step S31. In step S40, the data generation circuit 25 determines whether all the memory groups within the digital ID data area 8 have been assigned data. If the memory group being processed is the last memory group, the process ends. If not all the memory groups have been assigned data, then in step S41, the next memory group is focused and, in step S31, a mode and a data processing method are selected for the next memory group. As a result of completion of data processing on the last memory group, digital ID data (an example of individual identification information) is generated by the data generation circuit 25.

Next, the selection of a mode/process in step S31 in FIG. 11, described above, in the digital ID data generation process of the non-volatile memory device 10 according to the embodiment and reflected operations, namely, the setting of a reference memory cell in step S32 and the data processing in step S39, will be described in detail. FIG. 12 illustrates a relationship between conversion signals input to the data conversion circuit 28 and modes executed accordingly by the data conversion circuit 28. Here, the selection of a mode refers to a data conversion method performed by the data conversion circuit 28 in step S32, more specifically, a method by which the data conversion circuit 28 selects and sets a reference memory cell. Specifically, in order to generate digital ID data for a memory group including k+1 memory cells that are to be read in parallel, a signal α (or signal β) that is a conversion signal for selecting a mode and a parameter value i necessary to execute the mode are input to the data conversion circuit 28 to determine a reference memory cell on which binarization is based. Specifically, a Tout output mode is selected when the signal α is input, and a source address (SA) addressing mode is selected when the signal β is input. A signal including the signal α or signal β and the parameter value i may be used as a conversion signal.

Case of Selection of Tout Output Mode (Signal α)

Figure 13:
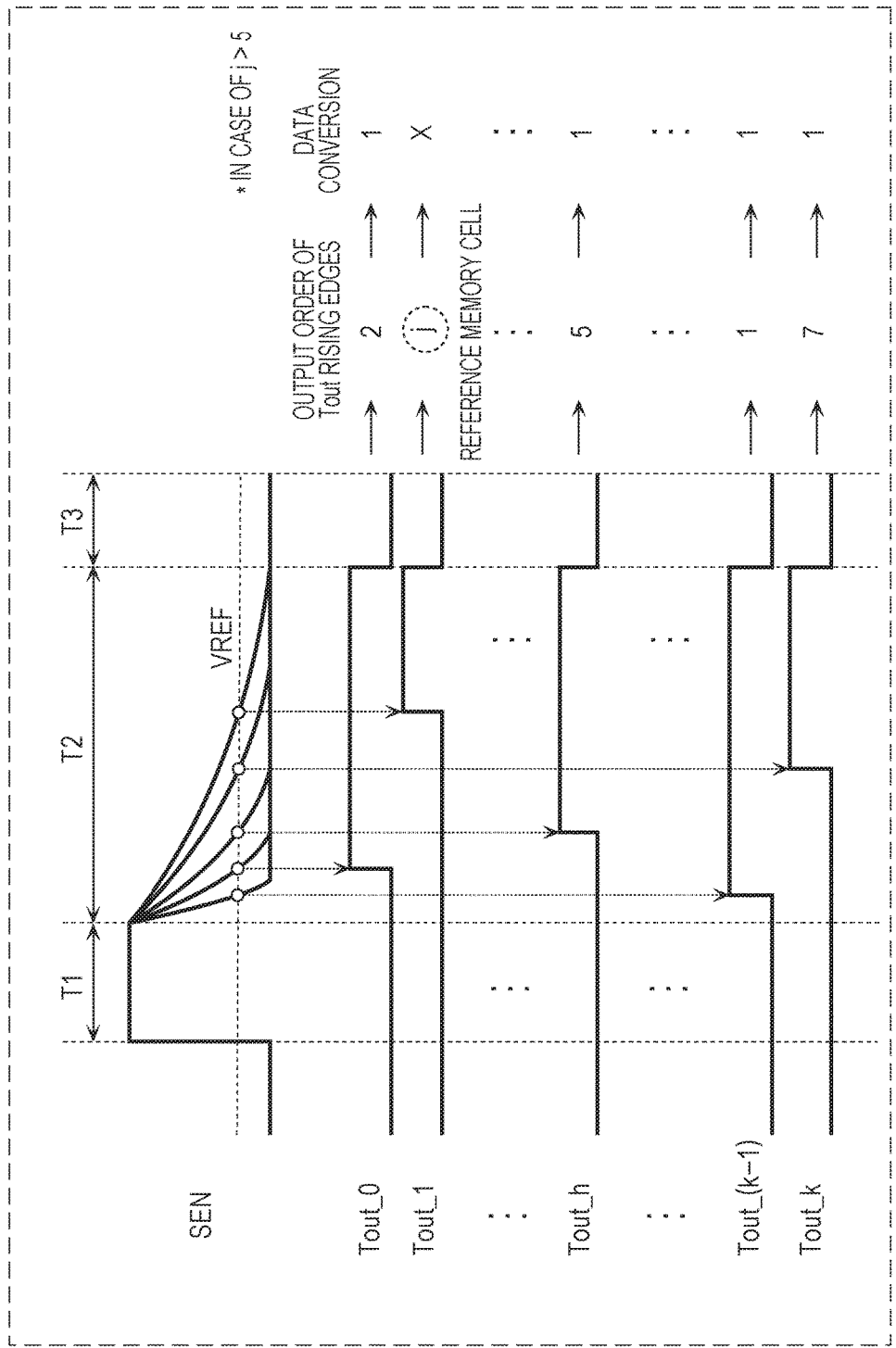
FIG. 13 is a timing chart depicting data conversion performed by the data conversion circuit in a Tout output mode.

Data conversion performed by the data conversion circuit 28 when the signal α, which represents the Tout output mode, and a parameter value j are input to the data conversion circuit 28 will be described with reference to a timing chart illustrated in FIG. 13. In a memory group within the digital ID data area 8, k+1 memory cells in the same resistance state are respectively connected to the k+1 sense amplifier circuits 30 and start discharging at the same timing in the sense period T2. The k+1 memory cells are in the same resistance state but have slight variations in resistance. Accordingly, the discharge characteristics (i.e., the pieces of time information output from the sense amplifier circuits 30) differ from one memory cell to another. That is, the rising edges which are output at the timing when the potential of the node SEN falls below VREF are also different and thus the resistance values of the k+1 memory cells in the memory group can be ranked in magnitude. In the Tout output mode, a reference memory cell is assigned to a memory cell from which a rising edge is output j-th, where j corresponds to the parameter value j, among the k+1 memory cells in the memory group. In the example illustrated in FIG. 13, a rising edge is output j-th from a memory cell corresponding to Tout_1. Thus, the output of binary data is based on the rising edge of Tout_1. Tout that rises at a timing earlier than the rising edge of Tout_1 is assigned data "1", and Tout that rises at a timing later than the rising edge of Tout_1 is assigned data "0". In the Tout output mode, accordingly, a reference memory cell depend on the parameter value and is assigned to a memory cell corresponding to the top M-th ranked piece of time information (M is greater than or equal to 2) among the pieces of time information on the plurality of memory cells in the memory group.

Case of Selection of SA Address Mode (Signal β)

Figure 14:
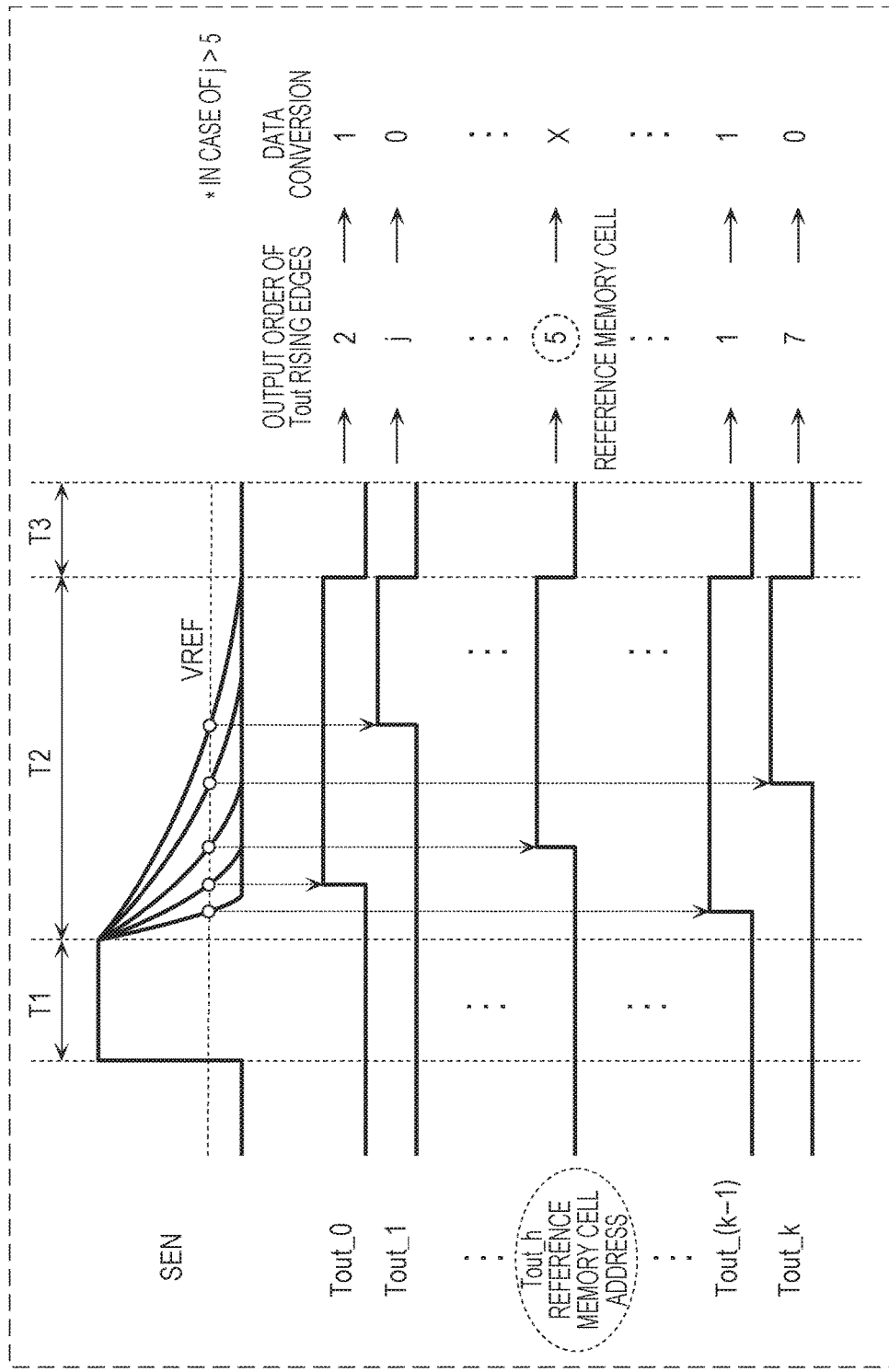
FIG. 14 is a timing chart depicting data conversion performed by the data conversion circuit in a source address (SA) addressing mode.

Data conversion performed by the data conversion circuit 28 when the signal β, which is a conversion signal indicating the SA addressing mode, and a parameter value h are input to the data conversion circuit 28 will be described with reference to a timing chart illustrated in FIG. 14. In a memory group within the digital ID data area 8, k+1 memory cells in the same resistance state are caused to operate at the same timing, and the respective resistance values are ranked in magnitude in a way similar to that in the Tout output mode. With respect to the parameter value h input in the SA addressing mode, a memory cell connected to the sense amplifier circuit 30 associated with Tout_h out of Tout_0 to Tout_k is assigned a reference memory cell. As illustrated in FIG. 14, in the sense period T2, rising edges are output at different timings, starting from Tout_(k−1). In the example illustrated in FIG. 14, the rising edge of Tout_h is output fifth in the memory group. In the SA addressing mode, since the memory cell corresponding to Tout_h is assigned a reference memory cell, a memory cell for which Tout rises at a timing earlier than Tout_h (i.e., memory cells for which Tout rises first to fourth) is assigned data "1" and a memory cell for which Tout rises at a later timing (i.e., memory cells for which Tout rises sixth to k-th) is assigned data "0". In the SA addressing mode, accordingly, a reference memory cell depends on the parameter value and is assigned to a memory cell corresponding to the top N-th ranked address (N is a natural number) among the addresses of the plurality of memory cells in the memory group.

In this embodiment, the reference memory cell is not handled as data, by way of example; however, the handling of the reference memory cell is not limited to this example. A memory cell designated as a reference memory cell may be assigned data "0" or data "1". That is, the data conversion circuit 28 may assign a first data value or second data value to the reference memory cell.

Next, the data processing executed by the data processing circuit 29 in step S39 illustrated in FIG. 11 will be described. FIG. 15 is an explanatory diagram of a relationship between processing signals input to the data processing circuit 29 and data processing methods executed accordingly by the data processing circuit 29. The data processing circuit 29 applies additional data processing to binary digital data output from the data conversion circuit 28 in accordance with a processing signal A (or a processing signal B or C). The processing signal A indicates an even-odd number scheme, the processing signal B indicates a majority decision scheme, and the processing signal C indicates no processing.

Case of Selection of Even-Odd Number Scheme (Signal A)

Figure 16:
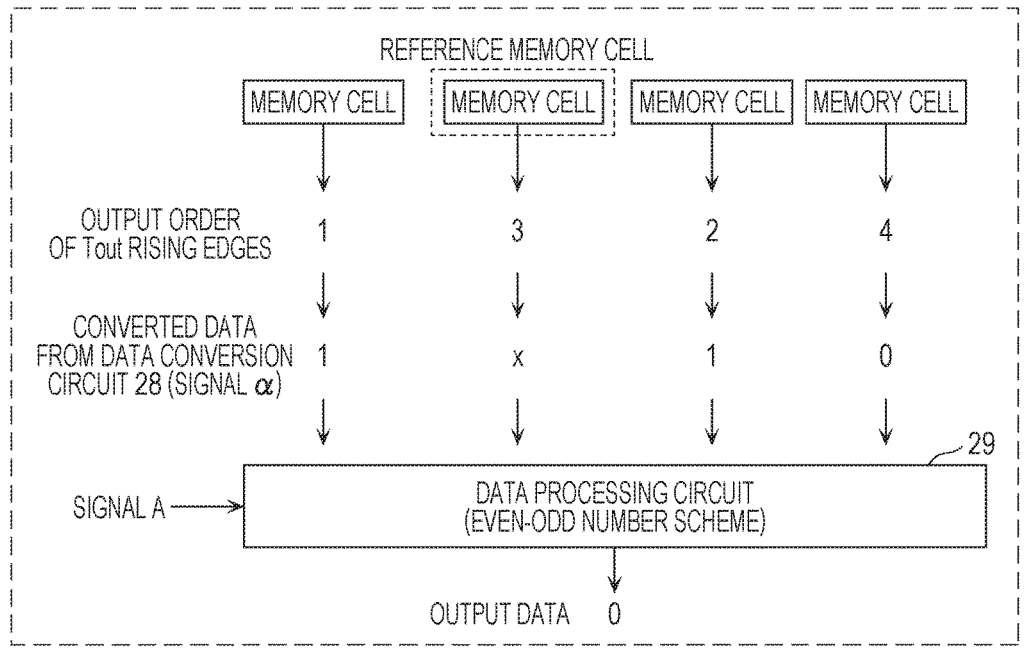
FIG. 16 is a diagram depicting data processing of the data processing circuit in an even-odd number scheme.

In a case where the signal A is input to the data processing circuit 29 as a processing signal, the data processing circuit 29 executes an even-odd number scheme. The even-odd number scheme will be described with reference to an example illustrated in FIG. 16. In the example illustrated in FIG. 16, memory cells (i.e., a memory group) to be simultaneously read in parallel are regarded as 4 bits, and a signal α (a signal for selecting the Tout output mode) and a parameter value 3 are input to the data conversion circuit 28. In the read circuit 11, after the reading of 4 bits has been simultaneously started, rising edges of Tout are sequentially output in accordance with variations in resistance value. In the data conversion circuit 28, since the parameter value is set as 3, a memory cell from which a rising edge is output third is assigned a reference memory cell, and the outputs of the other memory cells (i.e., data generation memory cells) are each converted into digital data "1" or "0" in accordance with the reference memory cell. In the even-odd number scheme, the data processing circuit 29 calculates the sum of the values of the digital data of the memory group, which is output from the data conversion circuit 28, and performs data processing in accordance with whether the determined sum is an even number or an odd number. In this embodiment, an even number is assigned 0 and an odd number is assigned 1. In the example illustrated in FIG. 16, the sum from the data conversion circuit 28 is an even number, and thus 0 is output as the final output of the data processing circuit 29.

In the even-odd number scheme, accordingly, the data processing circuit 29 performs data processing to calculate the sum of first data values and second data values that are assigned to a plurality of memory cells by the data conversion circuit 28 and to output the first data value when the sum is an odd number or output the second data value when the sum is an even number. One of the first data value or the second data value is an even number and the other data value is an odd number.

Case of Selection of Majority Decision Scheme (Signal B)

Figure 17:
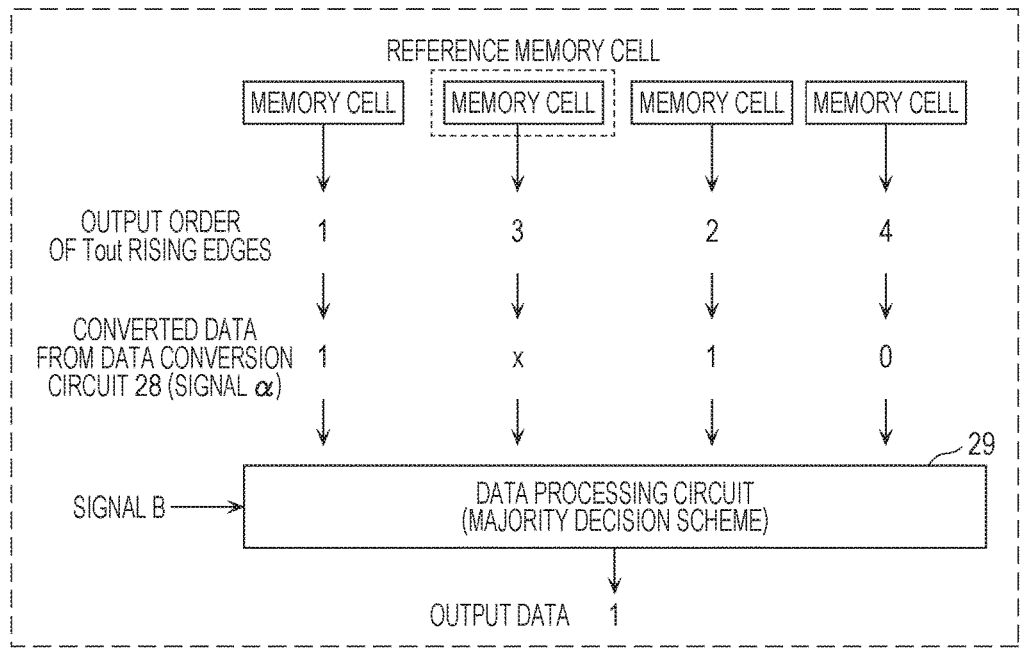
FIG. 17 is a diagram depicting data processing of the data processing circuit in a majority decision scheme.

In a case where the signal B is input to the data processing circuit 29 as a processing signal, the data processing circuit 29 executes a majority decision scheme. The majority decision scheme will be described with reference to an example illustrated in FIG. 17. In FIG. 17, the results of the preconditions (the number of bits to be read in parallel, the conversion mode, and the output order of rising edges of Tout) prior to the processing of the data processing circuit 29 are assumed to be the same as those in FIG. 16. In the majority decision scheme, the data processing circuit 29 calculates the numbers of 1s and 0s of the digital data output from the data conversion circuit 28 and compares the number of 1s with the number of 0s. The data processing circuit 29 outputs 1 when the number of 1s is larger, and outputs 0 when the number of 0s is larger. In the example illustrated in FIG. 17, the number of 1s is 2 and the number of 0s is 1. Since the number of Is is more than the number of 0s, 1 is output as the final output of the data processing circuit 29.

In the majority decision scheme, accordingly, the data processing circuit 29 performs data processing to calculate the numbers of first data values and second data values that are assigned to a plurality of memory cells by the data conversion circuit 28 and to output a first data value when the number of first data values is larger than the number of second data values or output a second data value when the number of first data values is larger than the number of second data values.

As described above, there is a case where different data may be output depending on the selected data processing method even if the same output is obtained from the data conversion circuit 28. With the use of the data processing circuit 29, the data output from the data conversion circuit 28 and the output data of the data processing circuit 29 are difficult to predict, and it is therefore expected that security will be increased or the randomness of digital ID data will be maintained upon occurrence of a circuit defect.

The circuit defect refers to, for example, a defect in the sense amplifier circuit 30 at an early stage after manufacturing. It is assumed that a defect has occurred in the x-th sense amplifier circuit 30 in the k+1 sense amplifier circuits 30 and a rising edge is always output at the latest regardless of the resistance state of the memory cell. When digital ID data is reproduced, digital data of memory cells in each memory group is generated in the address order. However, due to the defect in the x-th sense amplifier circuit 30, the same value is always output from the x-th memory cell, which makes the data have periodicity. As a result, randomness is low. In the data processing circuit 29 described in this embodiment, even if a defect has occurred in the sense amplifier circuit 30 in such a manner that fixed data is output, the data can be concentrated by processing so long as the other sense amplifier circuits 30 that operate in parallel are in operation, which makes the finally output data changeable. As a result, randomness can be maintained.

In a case where the signal C illustrated in FIG. 15 is input, the data processing circuit 29 may output data that remains unprocessed. In the case of no processing, no concentration is applied by means of data processing and the data of a memory cell which is accessed can be output in a single reproduction operation. In this case, the data includes a large amount of information. This scheme has merits in terms of data output speed.

Figure 18:
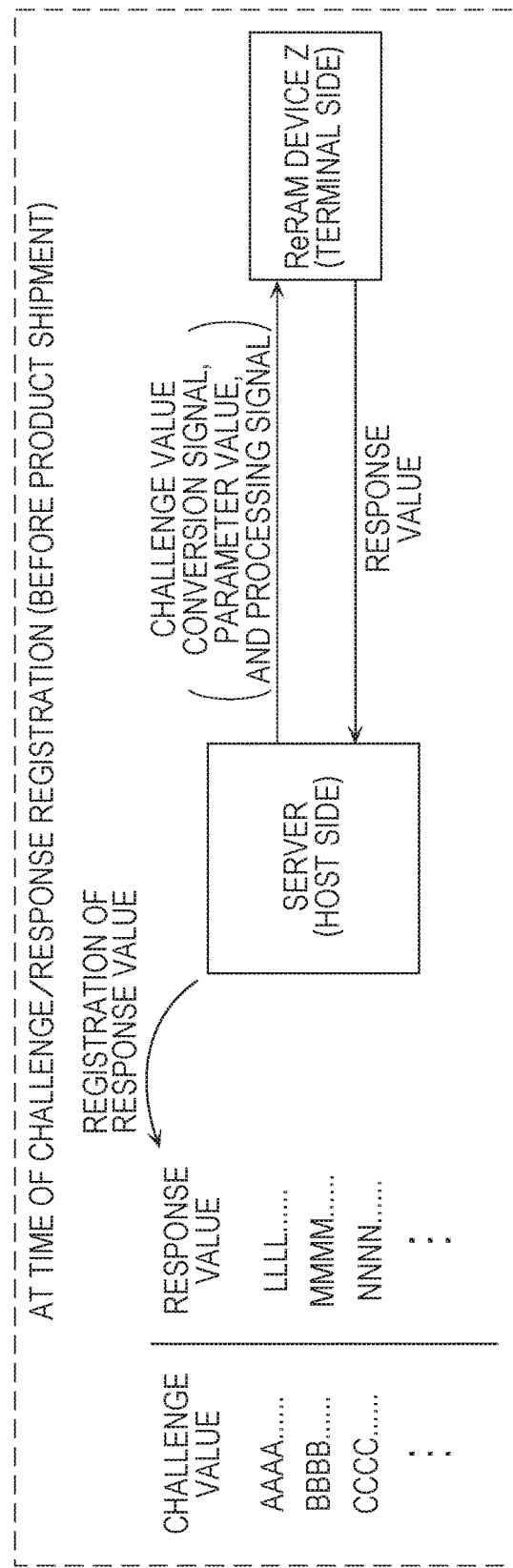
FIG. 18 is a diagram illustrating an example operation of challenge-response authentication before a terminal is shipped to the market.

Example Application of Non-Volatile Resistive Memory Device to System in this Embodiment The digital ID data generation scheme described in this embodiment is applicable to, for example, a technique of challenge-response authentication between the host side such as a server and the device side such as a terminal. The challenge-response authentication is a scheme for performing authentication by transmitting a challenge (input) registered in advance on the host side to the terminal, returning a response (output) specific to the terminal to the host side from the terminal, upon receipt of the input, in response to the input, and comparing a registered expected value with the response value on the host side. An example of the challenge-response authentication scheme according to this embodiment will be described with reference to FIGS. 18 and 19. As illustrated in FIG. 18, before shipment to the market, the server transmits a plurality of challenge values to a specific terminal (ReRAM device Z) and obtains a specific response value in response to the challenge values. Thereafter, the server registers the response value. In the digital ID data generation scheme described in this embodiment, the challenge values correspond to a conversion signal, a parameter value, and a processing signal that are input to the data generation circuit 25 in the terminal (ReRAM device Z). The response value corresponds to digital ID data (an example of individual identification information) output from the data generation circuit 25 in the terminal (ReRAM device Z).

Figure 19:
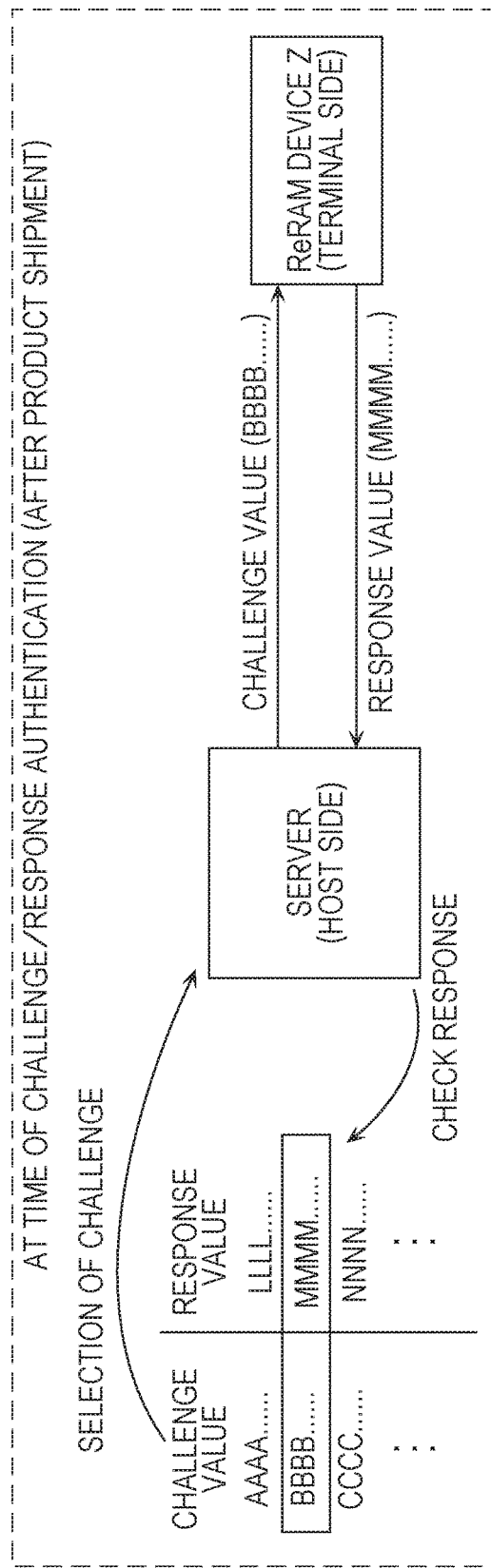
FIG. 19 is a diagram illustrating an example operation of challenge-response authentication after the terminal has been shipped to the market.

As illustrated in FIG. 19, in the authentication of the terminal after shipment to the market, the server selects any challenge value from among the challenge values registered before shipment and transmits the challenge value to the terminal, and, upon receipt of the challenge value, the terminal returns a response value in accordance with the challenge value. Upon receipt of the response value, the server checks the response value against the response value registered in advance. If both response values match, the authentication is completed.

In this example, authentication is completed after single checking of a challenge value and a response value. Alternatively, the checking of a challenge value and a response value may be repeated a plurality of times to perform authentication for increased security.

As described above, in a case where the non-volatile memory device 10 is used for challenge-response authentication, the data generation circuit 25 generates digital ID data (an example of individual identification information) by using the data conversion circuit 28 and the data processing circuit 29 on the basis of a challenge signal that at least includes a conversion signal and a processing signal when reproducing digital ID data (an example of individual identification information).

Figure 20:
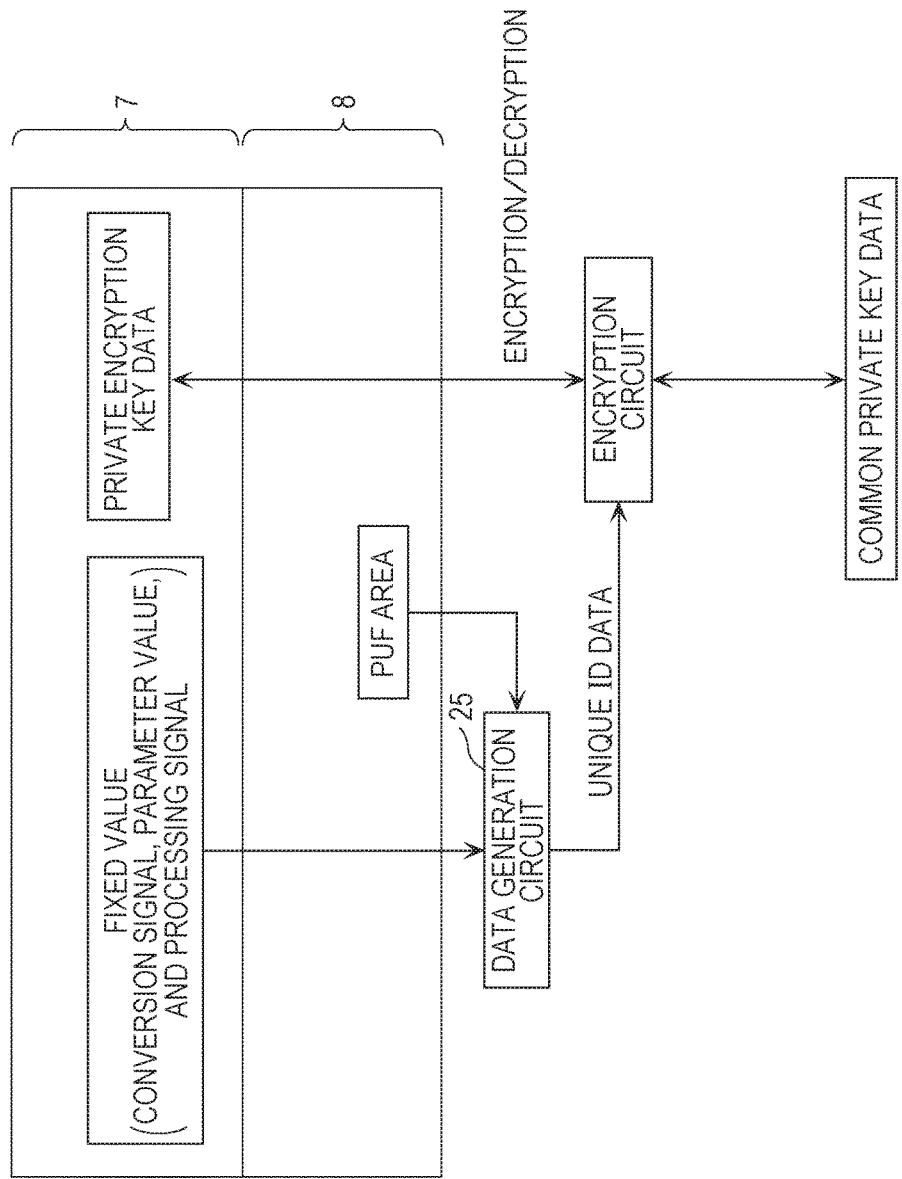
FIG. 20 is a diagram illustrating an example application of the non-volatile memory device to unique ID data technology.

The digital ID data generation scheme described in this embodiment is also applicable to unique ID data technology. An example application to unique ID data technology in this embodiment will be described with reference to FIGS. 20 and 21. As illustrated in FIG. 20, predetermined fixed values are stored in the user data area 7 of the non-volatile memory device 10 according to the embodiment. The fixed values, as used here, are a conversion signal, a parameter value, and a processing signal that are used to reproduce digital ID data. In unique ID data technology, resistance value information (specifically, time information) read from the digital ID data area 8, which is a PUF area, is reproduced by the data generation circuit 25 by using the fixed values. In unique ID data technology, therefore, unlike challenge-response authentication, the feature is implemented that an external input such as a challenge is not present and the same ID is always output when digital ID data is reproduced. In FIG. 20, the read circuit 11 is not illustrated for simplicity of illustration. In the unique ID data technology, common private key data is used as an encryption key. Common private key data which is encrypted with unique ID data is stored in the user data area 7 as private encryption key data.

Figure 21:
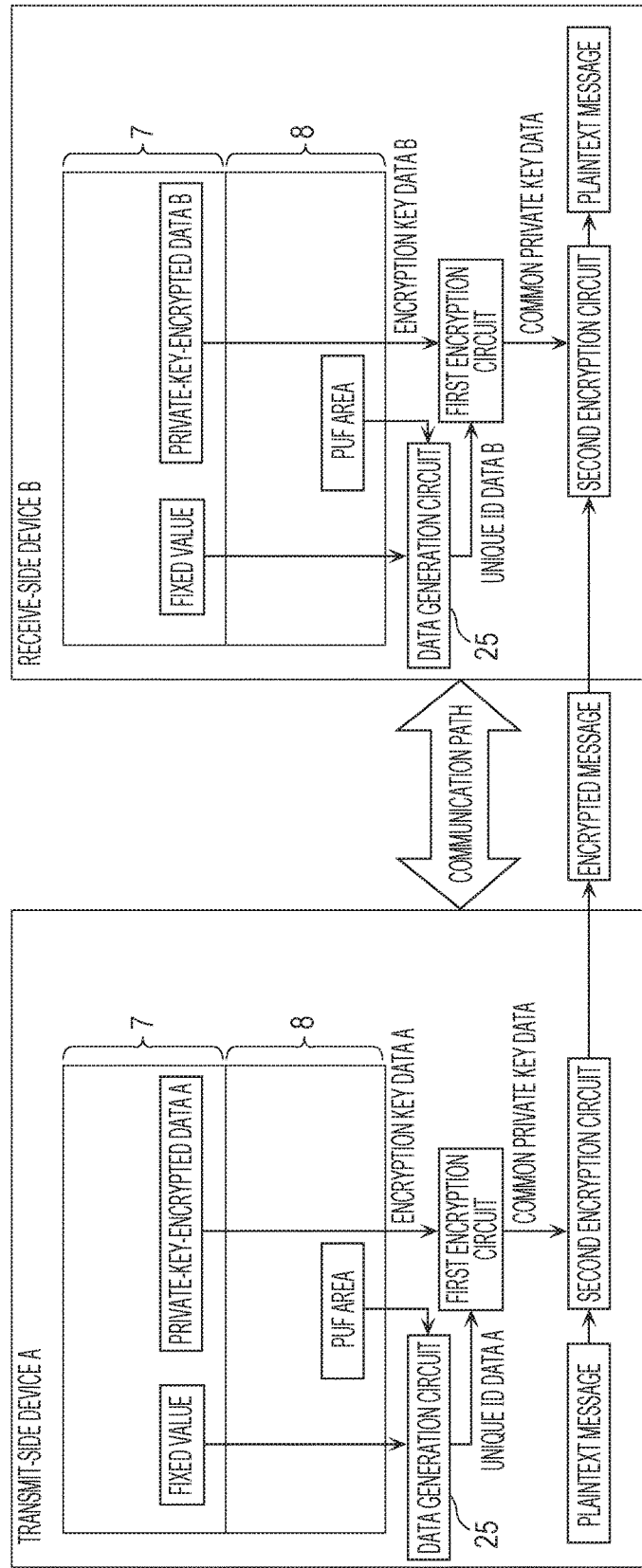
FIG. 21 is a diagram illustrating an example of data transmission and reception in the example application to unique ID data technology.

FIG. 21 illustrates an example of data transmission and reception in this embodiment. Device A on the transmit side and device B on the receive side each include the non-volatile memory device 10 according to this embodiment, and each store private-key-encrypted data in the user data area 7. The private-key-encrypted data is obtained by encrypting common private key data with unique ID data. In the device A on the transmit side, when a message is to be transmitted, private-key-encrypted data A is input to a first encryption circuit, and the first encryption circuit decrypts the private-key-encrypted data A into common private key data by using unique ID data A. The unique ID data A is obtained by the data generation circuit 25 receiving, via the read circuit 11, fixed values stored in the user data area 7 and time information obtained from the digital ID data area 8, which is the PUF area. The common private key data obtained as a result of decryption is used to encrypt a plaintext message input to a second encryption circuit to produce an encrypted message, and the encrypted message is transmitted to the device B. In the device B, as in the device A, a first encryption circuit decrypts private-key-encrypted data B into common private key data by using unique ID data B obtained from the data generation circuit 25. The received encrypted message is decrypted into the plaintext message by a second encryption circuit by using the common private key data.

The use of unique ID data described above enables more secure protection of common private key data. For example, if private encryption key data stored in the user data area 7 is stolen and copied to another device without permission, it is not possible to decrypt the private encryption key data since unique ID data for decrypting the private encryption key data differs from device to device. That is, it is possible to prevent dissemination of counterfeit devices after leakage of data.

As described above, in a case where the non-volatile memory device 10 is used in unique ID data technology, in the data generation circuit 25, when digital ID data (an example of individual identification information) is to be reproduced, a predetermined fixed conversion signal and processing signal are input to the data conversion circuit 28 and the data processing circuit 29, respectively, to generate digital ID data (an example of individual identification information).

As described above, the non-volatile memory device 10 according to this embodiment includes a memory cell array 20 constituted by a plurality of resistive memory cells 21 each capable of holding data by using a change in resistance value, a read circuit 11 that simultaneously performs a read operation on the memory cell array 20 in units of memory groups each including a plurality of memory cells 21 to obtain pieces of time information on the basis of a discharge phenomenon or charge phenomenon that depends on the respective resistance values of the plurality of memory cells 21, and a data generation circuit 25 that compares the pieces of time information on the plurality of memory cells 21, which are obtained by the read circuit 11 through the read operation, to generate individual identification information.

With this configuration, pieces of time information that depend on the resistance values of a plurality of resistive memory cells read by the read circuit 11 are compared with each other by the data generation circuit 25 to generate individual identification information. Thus, individual identification information is generated as PUF data that is based on variations of the resistance values of memory cells in the same resistance state. In addition, a circuit for generating individual identification information can be shared with a circuit mounted as a typical non-volatile memory device, and thus a non-volatile memory device having a function as a PUF with low power consumption and small space availability is realized.

In the embodiment described above, the read circuit 11 simultaneously performs a read operation on a plurality of memory cells 21 to obtain pieces of time information. However, the read circuit 11 may not necessarily perform a read operation on a plurality of memory cells 21 simultaneously.

Figure 22:
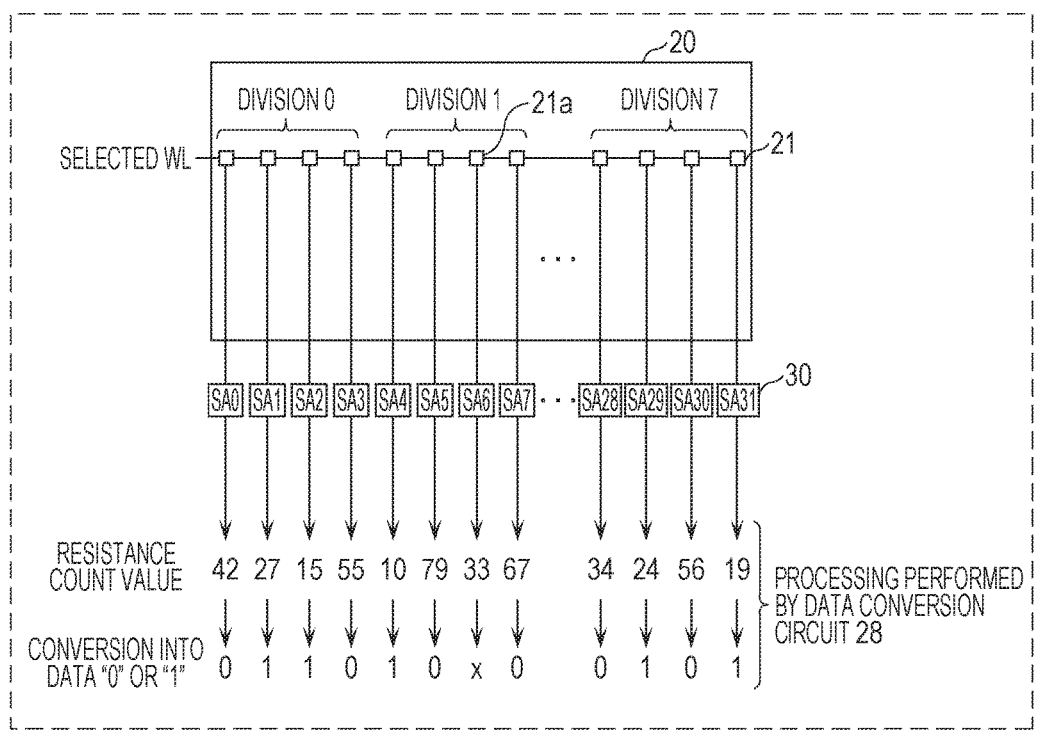
FIG. 22 is a diagram illustrating a read operation for a plurality of memory cells in a non-volatile memory device according to a first modification of the embodiment.

FIG. 22 is a diagram illustrating a read operation for a plurality of memory cells in a non-volatile memory device according to a first modification of the embodiment described above. In FIG. 22, an example is illustrated in which the reading of time information and the generation of individual identification information are performed in units of memory groups each including a plurality of memory cells of 32 bits but not all of the 32 bits are simultaneously subjected to a read operation.

As illustrated in FIG. 22, in the non-volatile memory device, a read operation is performed on the memory cell array 20 in units of memory groups each including memory cells 21 of 32 bits. However, not all of the memory cells 21 of 32 bits are read simultaneously but the memory cells 21 of 32 bits are divided into eight sub-groups (divisions 0 to 7) of 4 bits so that the eight sub-groups of memory cells 21 are sequentially subjected to a read operation. It is noted that 4 bits in each sub-group are simultaneously subjected to a read operation.

In the example illustrated in FIG. 22, one bit in division 1 is set as a reference memory cell 21a. The data conversion circuit 28 assigns "1" to time information smaller than time information (resistance count value) on the reference memory cell 21a or assigns "0" to time information larger than the time information on the reference memory cell 21a.

Figure 23:
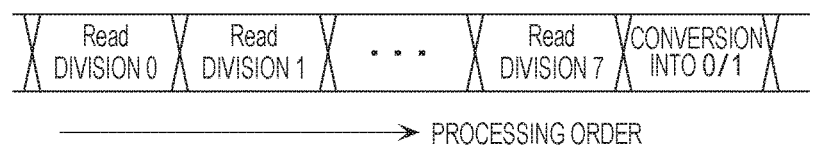
FIG. 23 is a timing chart illustrating the order in which the reading of time information and data conversion are performed in the non-volatile memory device according to the first modification of the embodiment.

FIG. 23 is a timing chart illustrating the order in which the reading of time information and data conversion are performed in the non-volatile memory device according to this modification. The memory cells 21 of 32 bits are divided into eight sub-groups of 4 bits so that the eight sub-groups are sequentially subjected to a read operation, and are then converted into 32-bit data by the data conversion circuit 28. That is, the data conversion circuit 28 performs a process for assigning "0" or "1" to the 32-bit data ("conversion into 0/1").

Figure 24:
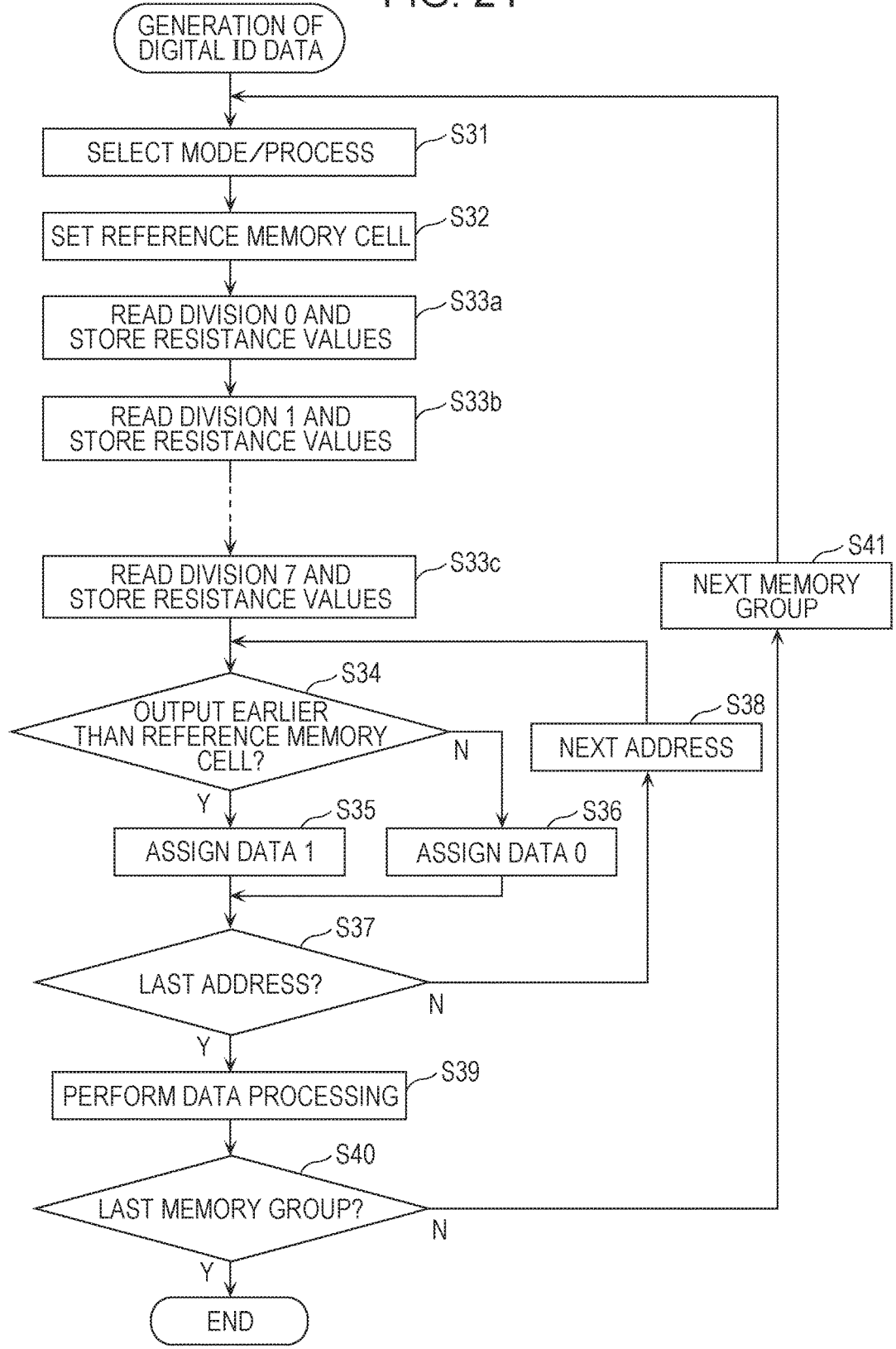
FIG. 24 is a flowchart illustrating an example operation of the non-volatile memory device according to the first modification of the embodiment.

FIG. 24 is a flowchart illustrating an example operation of the non-volatile memory device according to this modification. In the illustrated flowchart, the operation of reading resistance values in the PUF area (S33) in the flowchart in FIG. 11, which illustrates an example operation of the embodiment described above, is replaced with eight steps (the operation of reading division 0 and storing resistance values (S33a) to the operation of reading division 7 and storing resistance values (S33c)). The eight steps (the operation of reading division 0 and storing resistance values (S33a) to the operation of reading division 7 and storing resistance values (S33c)) correspond to the read operation performed sequentially in units of eight sub-groups of 4 bits in FIG. 23.

As described above, as in this modification, the operation of reading pieces of time information in units of memory groups each including a plurality of memory cells 21 does not need to be performed simultaneously on all the plurality of memory cells 21. All the plurality of memory cells 21 may be read at different timings or may be read sequentially in units of sub-groups into which a memory group including a plurality of memory cells 21 is divided.

In the embodiment described above, the data generation circuit 25 compares pieces of time information on a plurality of memory cells 21 obtained by the read circuit 11 through a read operation to generate individual identification information. However, the pieces of time information may not necessarily be compared with each other, and individual identification information may be generated on the basis of the rank of each of the pieces of time information on the plurality of memory cells 21 in ascending order or descending order.

Figure 25B:
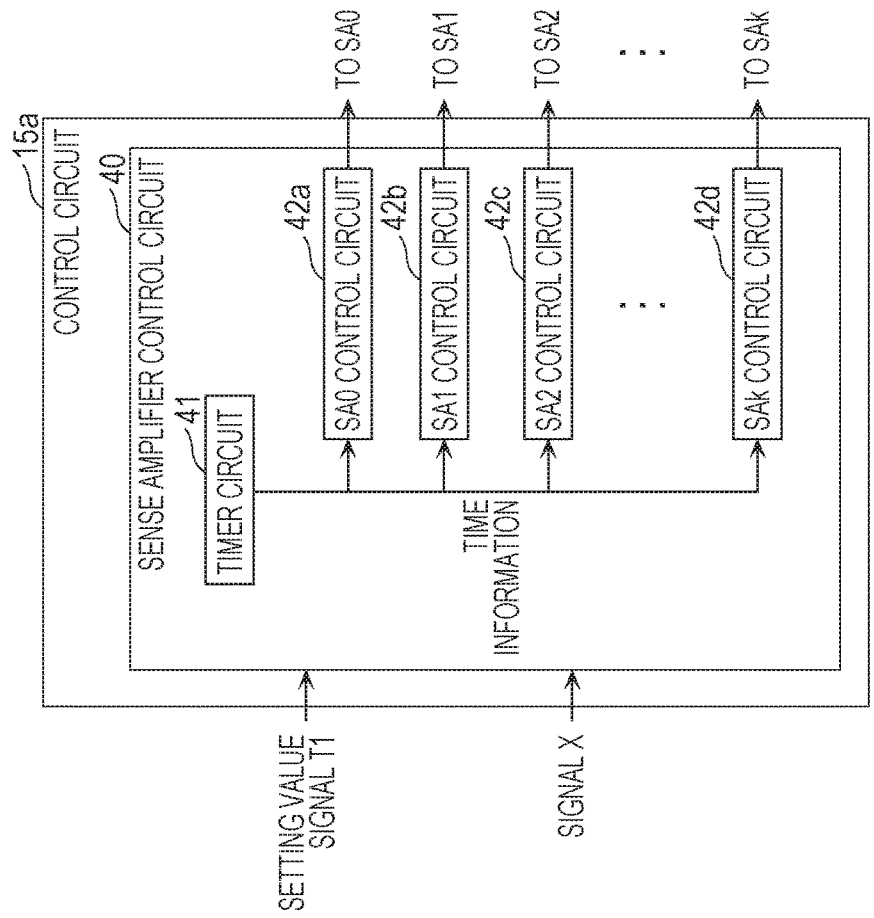
FIG. 25B is a block diagram illustrating a detailed configuration of an SA0 control circuit to an SAk control circuit illustrated in FIG. 25A.
Figure 25A:
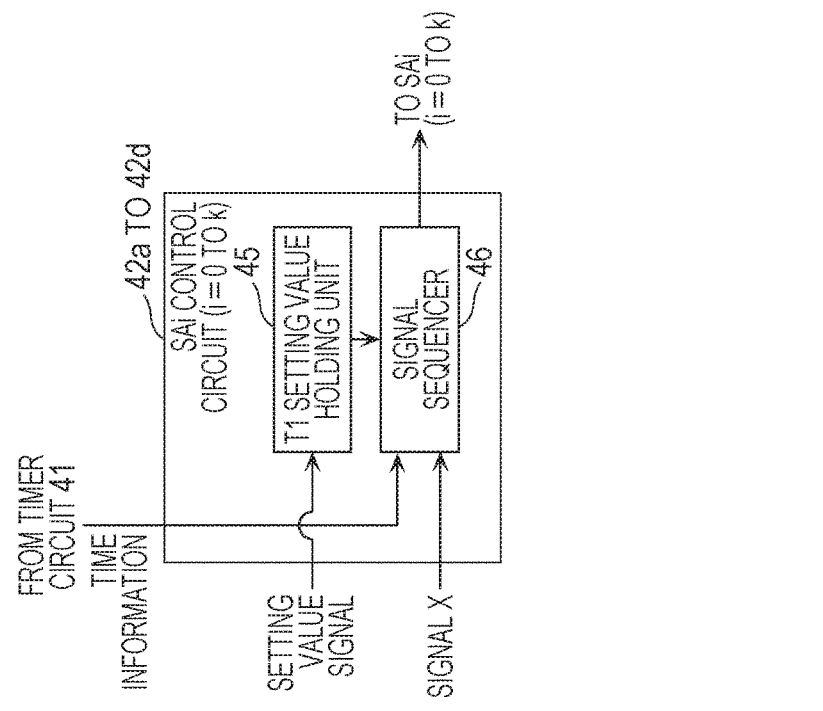
FIG. 25A is a block diagram illustrating a detailed configuration of a control circuit in a non-volatile memory device according to a second modification of the embodiment.

FIG. 25A is a block diagram illustrating a detailed configuration of a control circuit 15a in a non-volatile memory device according to a second modification of the embodiment described above. The illustrated configuration of the control circuit 15a is suitable for use in the generation of individual identification information on the basis of the rank of each of pieces of time information on a plurality of memory cells in ascending order or descending order.

The control circuit 15a includes, in addition to the functions of the control circuit 15 in the embodiment described above, a sense amplifier control circuit 40 that performs predetermined control on the basis of externally input control signals (a set value signal T1 and a signal X). The sense amplifier control circuit 40 selects whether to start sensing (start discharging) the sense amplifier circuits 30 that constitute the read circuit 11 simultaneously or at their respective set times.

The signal X is a mode selection signal for determining whether to cause the sense amplifier circuits 30 that constitute the read circuit 11 to simultaneously start sensing (time fixed mode) or to start sensing at their respective set times (time adjustable mode) by switching between the modes.

The set value signal T1 is a signal representing information indicating a start time of sensing for each of the sense amplifier circuits 30 in the time adjustable mode.

The sense amplifier control circuit 40 includes a timer circuit 41 and SA0 control circuit 42a to SAk control circuit 42d.

The timer circuit 41 supplies common time information to the SA0 control circuit 42a to the SAk control circuit 42d.

The SA0 control circuit 42a to the SAk control circuit 42d are circuits respectively provided for the sense amplifier circuits 30 constituting the read circuit 11, each for outputting a signal indicating the start timing of sensing for the corresponding sense amplifier circuit 30. As illustrated in FIG. 25B, each of the SA0 control circuit 42a to the SAk control circuit 42d includes a T1 setting value holding unit 45 and a signal sequencer 46.

The T1 setting value holding unit 45 is a memory for holding information (T1 setting value) on the time specified for the corresponding sense amplifier circuit 30 out of the information indicated by the set value signal T1. The signal sequencer 46 outputs a signal indicating that sensing starts at the same timing to all the sense amplifier circuits 30 in accordance with the time information from the timer circuit 41 when the signal X indicates the time fixed mode. When the signal X indicates the time adjustable mode, the signal sequencer 46 outputs a signal indicating that sensing starts at a timing when the time information from the timer circuit 41 reaches the T1 setting value held in the T1 setting value holding unit 45.

Figure 26:
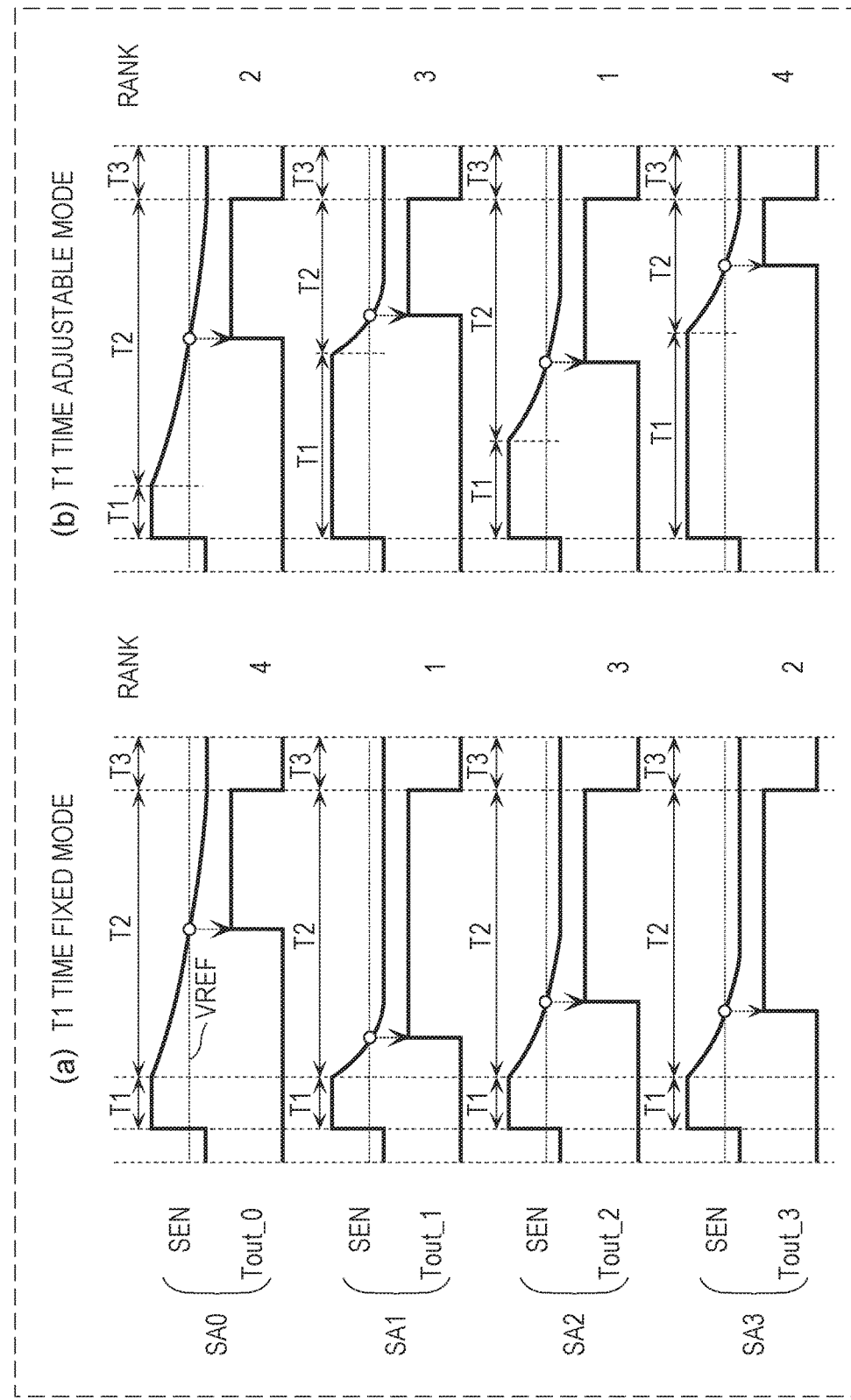
FIG. 26 illustrates timing charts depicting example operations of a read circuit in the non-volatile memory device according to the second modification of the embodiment.

FIG. 26 illustrates timing charts depicting example operations of the read circuit 11 in the non-volatile memory device according to this modification. FIG. 26($a$) illustrates an example operation in the time fixed mode and FIG. 26($b$) illustrates an example operation in the time adjustable mode. In FIGS. 26($a$) and 26($b$), the timings of discharge for four sense amplifier circuits 30 (SA0 to SA3) and the ranks of the four sense amplifier circuits 30 (SA0 to SA3), which are detected by the data conversion circuit 28, are illustrated.

As illustrated in FIG. 26($a$), when the signal X indicates the time fixed mode, under control of the sense amplifier control circuit 40, the sense amplifier circuits 30 (SA0 to SA3) simultaneously start discharging and output signals Tout_0 to Tout_3 each indicating a timing T2 of the end of discharging. Thus, the data conversion circuit 28 detects the ranks of the sense amplifier circuits 30 (SA0 to SA3) in order of their timings T2 of the end of discharging from earliest to latest (that is, in the order in which the pieces of time information based on discharging are listed from smallest to largest, or in ascending order). In the illustrated example, SA1, SA3, SA2, and SA0 are ranked first, second, third, and fourth, respectively.

As illustrated in FIG. 26($b$), when the signal X indicates the time adjustable mode, under control of the sense amplifier control circuit 40, the sense amplifier circuits 30 (SA0 to SA3) start discharging at the times corresponding to the T1 setting values associated therewith and output signals Tout_0 to Tout_3 each indicating the timing T2 of the end of discharging. Thus, the data conversion circuit 28 detects the ranks of the sense amplifier circuits 30 (SA0 to SA3) in order of their timings T2 of the end of discharging from earliest to latest (that is, in the order in which the pieces of time information based on discharging are listed from smallest to largest, or in ascending order). In the illustrated example, SA2, SA0, SA1, and SA3 are ranked first, second, third, and fourth, respectively. In this modification, the sense amplifier circuits 30 are ranked in ascending order on the basis of time information. Alternatively, the sense amplifier circuits 30 may be ranked in descending order on the basis of time information.

Thereafter, as in the embodiment described above, the data conversion circuit 28 performs data conversion to assign a first data value (e.g., "1") to a memory cell that outputs a piece of time information ranked higher than the piece of time information on the reference memory cell 21a and to assign a second data value (e.g., "0") to a memory cell that outputs a piece of time information ranked lower than the piece of time information on the reference memory cell 21a. As in the embodiment described above, the data obtained as a result of the data conversion is subjected to data processing by the data processing circuit 29 and is then output from the data generation circuit 25 as individual identification information.

In this modification, as described above, a non-volatile memory device includes a memory cell array 20 constituted by a plurality of resistive memory cells 21 each capable of holding data by using a change in resistance value, a read circuit 11 that performs a read operation on the memory cell array 20 in units of memory groups each including a plurality of memory cells 21 to obtain pieces of time information on the basis of a discharge phenomenon or charge phenomenon that depends on the respective resistance values of the plurality of memory cells 21, and a data generation circuit 25 that generates individual identification information on the basis of a rank of each of the pieces of time information on the plurality of memory cells 21, which are obtained by the read circuit 11 through the read operation, in ascending order or descending order.

With this configuration, the data generation circuit 25 generates individual identification information on the basis of the order in which the pieces of time information that are read by the read circuit 11 and that depend on the resistance values of the plurality of resistive memory cells 21 are ranked. Thus, individual identification information is generated as PUF data that is based on variations of the resistance values of memory cells in the same resistance state. In addition, a circuit for generating individual identification information can be shared with a circuit mounted as a typical non-volatile memory device, and thus a non-volatile memory device having a function as a PUF with low power consumption and small space availability is realized.

Furthermore, the sense amplifier control circuit 40 can start the operation of the sense amplifier circuits 30 at their respective set times on the basis of the signal X.

This configuration eliminates the dependence of the respective resistance values of the plurality of memory cells 21 on time information that is based on a discharge phenomenon or charge phenomenon and makes it difficult to predict data from resistance values obtained by physical attacks such as probing, for example. As a result, security can be enhanced.

In addition, the data generation circuit 25 includes the data conversion circuit 28 that performs data conversion to set at least one of a plurality of memory cells 21 in a memory group as a reference memory cell 21a and to assign a first data value to a data generation memory cell among the plurality of memory cells 21, except for the reference memory cell 21a, when a piece of time information on the data generation memory cell is ranked higher than a piece of time information on the reference memory cell 21a or assign a second data value to the data generation memory cell when the piece of time information on the data generation memory cell is ranked lower than the piece of time information on the reference memory cell 21a. The data generation circuit 25 generates individual identification information on the basis of data obtained as a result of the data conversion performed by the data conversion circuit 28.

With this configuration, at least one of a plurality of memory cells 21 constituting a memory group serves as the reference memory cell 21a and is used for the comparison of the pieces of time information in terms of rank. This configuration enhances the randomness of the individual identification information to be generated, compared with the case where the reference memory cell 21a is fixedly set.

Numerous modifications and alternative embodiments of the present disclosure will be apparent to those skilled in the art in view of the foregoing description. Accordingly, the foregoing description is to be construed as illustrative only and is presented for the purpose of teaching those skilled in the art the best mode of carrying out the present disclosure. The details of the structure and/or function may be modified substantially without departing from the spirit of the present disclosure.

A non-volatile memory device according to an embodiment of the present disclosure stably and securely generates irreproducible unique digital ID data from variations of the respective resistance values of resistive memory elements included in the memory device, and is suitable for incorporation into ICs, system-on-chip (SoC) devices, and other products to perform data encryption using digital ID data and access host computers and servers through authentication.

What is claimed is:
1. A non-volatile memory device comprising:
   a memory cell array that includes one or more memory groups each including memory cells, each of the memory cells having variable resistance value to hold a piece of data;
   a read circuit that, for each of the one or more memory groups, performs a read operation to obtain pieces of time information related to the memory cells in the memory group; and
   a data generation circuit that generates individual identification information on a basis of order of the memory cells in each of the one or more memory groups, the order corresponding to ascending order or descending order of the pieces of time information related to the memory cells in the memory group, wherein
   the read circuit obtains each of the pieces of time information on a basis of a discharge phenomenon or charge phenomenon that depends on the resistance value of a corresponding one of the memory cells.

2. The non-volatile memory device according to claim 1, wherein for each of the one or more memory groups, the read circuit simultaneously reads at least two of the memory cells in the memory group in the read operation.

3. The non-volatile memory device according to claim 1, wherein
   the data generation circuit, for each of the one or more memory groups, performs data conversion of signals indicating the pieces of time information, and
   the data generation circuit, for the data conversion,
      determines one of the memory cells in the memory group as a reference memory cell, and
      assigns a first value to a memory cell of the memory cells except for the reference memory cell when a piece of time information on the memory cell is ranked in the order higher than a piece of time information on the reference memory cell, or
      assigns a second value, which is different from the first value, to a memory cell of the memory cells except for the reference memory cell when a piece of time information on the memory cell is ranked lower in the order than the piece of time information on the reference memory cell, and
   wherein the data generation circuit generates the individual identification information on a basis of data obtained as a result of the data conversion.

4. The non-volatile memory device according to claim 1, wherein the data generation circuit, for each of the one or more memory groups, performs data conversion of signals indicating the pieces of time information, and the data generation circuit, for the data conversion, determines one of the memory cells in the memory group as a reference memory cell, and assigns a first value to a memory cell of the memory cells except for the reference memory cell when, as a result of comparison between a piece of time information on the memory cell and a piece of time information on the reference memory cell, the piece of time information on the memory cell is smaller than the piece of time information on the reference memory cell, or assigns a second value, which is different from the first value, to a memory cell of the memory cells except for the reference memory cell when, as a result of comparison between a piece of time information related to the memory cell and a piece of time information on the reference memory cell, the piece of time information on the memory cell is larger than the piece of time information on the reference memory cell, and wherein the data generation circuit generates the individual identification information on a basis of data obtained as a result of the data conversion.

5. The non-volatile memory device according to claim 3, wherein a memory cell corresponding to an M-th piece of time information in the ascending order or descending order of the pieces of time information is determined as the reference memory cell, where M is greater than or equal to 2.

6. The non-volatile memory device according to claim 3, wherein the data generation circuit assigns the first value or the second value to the reference memory cell.

7. The non-volatile memory device according to claim 3, wherein a memory cell corresponding to a N-th address among addresses of the memory cells in the memory group is determined as the reference memory cell, where N is a natural number.

8. The non-volatile memory device according to claim 3, wherein one of the first value or the second value is an even number and the other value is an odd number, wherein the data generation circuit, for each of the one or more memory groups, performs data processing to calculate a sum of first values and second values assigned by the data generation circuit and to output the first value when the sum is an odd number or output the second value when the sum is an even number, and wherein the data generation circuit generates the individual identification information on a basis of data obtained as a result of the data processing.

9. The non-volatile memory device according to claim 3, wherein the data generation circuit, for each of the one or more memory groups, performs data processing to calculate the number of first values and the number of second values assigned by the data generation circuit and to output the first value or the second value when the number of first values is larger than the number of second values or output the second value or the first value when the number of first values is smaller than the number of second values, and wherein the data generation circuit generates the individual identification information on a basis of data obtained as a result of the data processing.

10. The non-volatile memory device according to claim 8, wherein the data generation circuit selects a method for the data conversion in accordance with a conversion signal, and selects a method for the data processing in accordance with a processing signal, and wherein the data generation circuit generates the individual identification information on a basis of a challenge signal, the challenge signal including the conversion signal and the processing signal.

11. The non-volatile memory device according to claim 8, wherein the data generation circuit selects a method for the data conversion in accordance with a conversion signal, and selects a method for the data processing in accordance with a processing signal, and wherein the data generation circuit generates the individual identification information by inputting a predetermined fixed conversion signal and a predetermined fixed processing signal.

\* \* \* \* \*